US 6,545,507 B1

(12) United States Patent
Goller

(10) Patent No.: US 6,545,507 B1
(45) Date of Patent: Apr. 8, 2003

(54) FAST LOCKING CDR (CLOCK AND DATA RECOVERY CIRCUIT) WITH HIGH JITTER TOLERANCE AND ELIMINATION OF EFFECTS CAUSED BY METASTABILITY

(75) Inventor: Joerg Erik Goller, Zweikirchen (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/015,140

(22) Filed: Oct. 26, 2001

(51) Int. Cl.[7] .............................................. H03K 19/00
(52) U.S. Cl. ................................ 326/93; 326/94; 326/9
(58) Field of Search ............................... 326/93, 94, 9, 326/11, 12

(56) References Cited

U.S. PATENT DOCUMENTS

| 5,412,698 | A | * | 5/1995 | Van Brunt et al. .......... 375/373 |
| 6,055,286 | A | | 4/2000 | Wu et al. |
| 6,064,235 | A | | 5/2000 | Hayashi et al. |
| 6,124,762 | A | * | 9/2000 | Yoshida ........................ 331/11 |
| 6,225,831 | B1 | | 5/2001 | Dalmia et al. |

OTHER PUBLICATIONS

"Communications Protocols", taken from the Internet at http://www.erg.abdn.ac.uk/users/gorry/course/intro-pages/protocols.html, Jul. 16, 2001, 2 pages.

"Encapsulation of PDUs", taken from the Internet at http://www.abdn.ac.uk/users/gorry/course/intro-pages/encapsulation.html, Jul. 16, 2001, 2 pages.

"Overview of Frame Relay", Data Comm for Business, Inc., taken from the Internet at http://www.dcbnet.com/notes/framerly.html, Jul. 16, 2001, 7 pages.

"Packet Switching", taken from the Internet at http://www-.erg.abdn.ac.uk/users/gorry/course/intro-pages/ps.html, Jul. 16, 2001, 2 pages.

* cited by examiner

Primary Examiner—Michael Tokar
Assistant Examiner—Anh Tran
(74) Attorney, Agent, or Firm—J. Dennis Moore; W. James Brady, III; Frederick J. Telecky, Jr.

(57) ABSTRACT

A system 400 and method 1200 is disclosed for a fast locking (e.g., within 1.5 sync bit times or the first data transition) clock and data recovery (CDR) system used in high speed data communications applications (e.g., ASIC and microprocessor chips). The CDR circuit takes multiple (e.g., 8) phases of the local clock, which are offset (e.g., by 45 degrees), and uses the multiple phases to latch the state of data at multiple times, and uses the latched data to determine which of the multiple phases captured a data transition. The CDR circuit compares the indicated phase to the phase used to capture a previous data transition and uses such information to, produce a stable selection of a clock phase. The selected clock phase is then employed to provide a recovered clock and data signals (CLK_OUT, and DATA_OUT), in association with the incoming serial data stream independent of jitter and free of metastable conditions.

13 Claims, 16 Drawing Sheets

FAST LOCKING CDR (CLOCK AND DATA RECOVERY CIRCUIT) WITH HIGH JITTER TOLERANCE AND ELIMINATION OF EFFECTS CAUSED BY METASTABILITY

TECHNICAL FIELD OF INVENTION

The present invention relates generally to serial data communication and transmission applications in the manufacture of integrated circuits needed as physical interface to any type of serial bus (in this example USB). More particularly, the present invention relates to clock and data recovery logic for a serial data stream, which supplies a sync lock within 1.5 bit times, insuring clock and data information is recovered in these applications. The CDR function is implemented as a plesiochronous technique with no feedback to a PLL. It also has no lock detection, nor loss of lock detection, nor loss of sync detection. In the intended application, those functions are integrated into the logic coupled to the recovered CLK and DATA.

BACKGROUND OF THE INVENTION

With the recent increased speed of computers and the need for high performance peripherals, the use of high speed serial data communications applications in integrated circuits built to physically interface to any given bus has increased correspondingly.

USB (Universal Serial Bus) 1.1, has been the de facto external connectivity standard between computers and their peripherals in serial communications up to 12 Mbps (Million bits per second). As the need for faster communications and higher performance peripherals has grown, computer and peripheral manufacturers have responded with a new higher speed standard: USB 2.0.

USB 2.0 increases the device data throughput up to 480 Mbps, 40 times faster than USB 1.1 devices while maintaining or improving on other USB 1.1 specifications such as the Microsoft Plug and Play feature, and numerous other technical specifications, some of which will be discussed in relation to the present invention. USB 2.0 even challenges FireWire (IEEE 1394) currently at 400 Mbps, as the serial interface of the future. Three speed modes are available under the new USB 2.0 standard: high-speed (480 Mbps), full-speed (12 Mbps), and low-speed (1.5 Mbps).

Conventionally, an incoming serial data stream may be NRZI (Non-Return-to-Zero Inverted) encoded and bit stuffed. NRZI is a data transmission method in which the polarity of the bit is reversed whenever a 0 bit is encountered, and a static voltage level is transmitted whenever a 1 bit is encountered as illustrated in FIG. 1, and designated at reference numeral 110. NRZI thus uses the presence or absence of a transition to signify a bit (indicating a logical 0 by inverting the state). Combined with bit-stuffing, where an extra 0 bit is inserted after every six consecutive 1 bits, this data encoding causes a guaranteed transition every 7 bit times when a data payload would be all 1 bits. Every transition gives the CDR circuit phase information that it uses to align it's recovered clock to the phase of the incoming data. The less time between transitions, the less phase error which is to be expected caused by frequency offset. Other techniques used are, for example, 8b–10b coding similar to 1394 and Ethernet.

The structure of the data stream follows a specific communications protocol, which defines the rules for sending a block of data (each known as a Protocol Data Unit (PDU)) (e.g., 150 of FIG. 2) from one node in a network to another node. The exchanged PDUs comprises three parts: a sync sequence 160, a packet payload (also known as a Service Data Unit (SDU)) 170, and an End of Packet (EOP) 180. The protocol does not define or constrain the data carried in the payload portion 170 of the data block. The protocol does, however, specify the format of the sync sequence.

Packet switching refers to protocols in which a longer message (the data) exceeding a network-defined maximum length is divided into short message packets before they are transmitted. Each packet, with an associated header with information for routing the packet from origination to destination, is then transmitted individually and can even follow different routes to its destination. Once all the packets forming a message arrive at the destination, they are recompiled into the original message. Most modern Wide Area Network (WAN) protocols, including the successful TCP/IP protocol, as well as X.25, and Frame Relay, are based on packet-switching technologies.

A fundamental difference between packet communication and conventional, continuous-type communication is that the data is formed into packets as described above. When there is no data to be sent, the bus is put into an ideal state that shows no change in voltage levels. Continuous-type protocols is would fill the idle time within a frame with well-known "idle" patterns which are used to occupy the link when there is no data to be communicated. A packet network equipment discards the "idle" patterns between packets and processes the entire packet as one piece of data. The equipment examines the packet header information (PCI) and then either removes the header (in an end system) or forwards the packet to another system. If the out-going link is not available, then the packet is placed in a queue until the link becomes free. A packet network is formed by links which connect packet network equipment.

In the packet switching used in USB 2.0 at 480 Mbps, one portion of the packet header 160 will contain at least 12 sync bits indicated by an alternating pattern, intended to allow the sending and receiving clocks time to synchronize. The packet payload 170 will contain up to 1024 bits, while the end-of-packet 180 contains 8 bits.

The incoming data stream is assumed to be sent with a clock of the same frequency as the local clock used in the receiving system, but shows all jitter components of an electrical transmission over a bandwidth limited media (e.g., data dependant cycle to cycle jitter).

A conventional linear clock and data recovery (CDR) circuit attempts to recover the original transmitting clock by utilizing a phase detector (PD) or alternatively a phase-frequency detector (PFD), and source a charge pump followed by a VCO of an analog PLL. The resulting change in phase and frequency is sourced back to the PD/PFD to be compared to the next data. These conventional linear techniques use an analog PLL, which need an undefined number of transitions, are dependant on the PLLs bandwidth, the data-rate to VCO frequency ratio and more. In addition, data derived by these conventional linear techniques cannot be guaranteed by the USB synch packet (typically N×10e3 needed vs 6 available in USB FS mode).

The capture range of a PLL is typically narrow, and usually requires the help of a frequency acquisition aid and special training sequences which have the disadvantage of limited availability.

Other conventional plesiochronous techniques to minimize the effect of metastable readings give unreliable phase information. To do so, most of these techniques try to average the results before selecting a new phase. This also requires a continuous bitstream that is not available in USB applications.

The analog types require many special analog components, including rectifier component(s), differentiator component(s), etc. These components are difficult to implement in ASIC devices, and when not carefully designed may not function properly under all conditions. The digital implementations have at most +/−50% usable frequency range, but are often narrower depending on the implementation and the statistics of the input data.

For a number of reasons such as bus turn around timing (the time measured at the USB host controller, from the sending of a request to the farthest bus subscriber, until receipt of an acknowledge package), a USB HUB is allowed to strip-off a defined number of sync bits during the HS repeater mode which results in a minimum sync pattern of 12 alternating bits at the receiver of a subscriber. Under FS conditions the sync field consists of 6 bits from the start. This is not enough sync bits for conventional CDR techniques.

Another prior art CDR methodology is illustrated in FIG. 3 and designated at reference numeral 200. The CDR 200 uses a crystal oscillator 220 to drive a PLL along with frequency dividers 230 to produce two phases of a local clock (CLK, and CLK(NOT)) 235 which enter the CDR circuit 210. The serial data stream is decoded from a USB transmitter/receiver 240 to a single ended signal DATA 245 which also enters the CDR circuit 210. Two 4-bit shift registers 260, 270 are incorporated to store 8 bits of the serial data. A voting logic circuit 290 is employed to select one of the clock phases, while averaging sample points 280, 285 of the 8 data bits to minimize the effects of metastable conditions in the CDR circuit 210. The selected phase 291 from the voting logic 290 then provides feedback 291 to control the PLL clock frequency 230 and is then used by gate logic 295, to gate the data stream to recover the clock and the data 297. The disadvantage of this scheme is that there is an 8 bit time-delay while the bits fill both shift registers before the clock frequency and phase can be established. In addition, and as described above, after a number of rerouting operations there may not be enough sync bits remaining to provide lock and may cause a loss of data. Here again, jitter in the data stream or isolated bit errors may also cause the PLL to lose lock, as the PLL frequency and lock is dependant on the feedback loop from the voting logic 290.

Accordingly, considering the substantially higher data rates used in the new USB 2.0 at 480 Mbps, the new 350 ps cycle to cycle jitter specification under HS conditions (1 bit=2.08 ns ), and the increased use of hubs and routers, there is a need for a CDR circuit which is able to quickly lock to a serial data stream, have a high jitter tolerance, and yet eliminate the effects of metastable conditions inherent in CDR circuits used in high speed serial data communications applications of ASIC and microprocessor chips.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to a quick locking (e.g., within two sync bit times) clock and data recovery (CDR) circuit used in high speed data communications applications (e.g., ASIC and microprocessor chips). The CDR circuit takes multiple (e.g., 8) phases of the local clock, which are offset (e.g., by 45 degrees), and uses the multiple phases to latch the state of data at multiple times, and uses the latched data to determine which of the multiple phases captured a data transition. The CDR circuit compares the indicated phase to the phase used to capture a previous data transition and uses such information to, produce a stable selection of a clock phase. The selected clock phase is then employed to provide a recovered clock and data signal in association with the incoming serial data stream independent of jitter and free of metastable conditions.

In accordance with the present invention, a CDR circuit for a serial data stream is disclosed. The CDR circuit requires only one data transition on the incoming data stream in order to pick one of the 8 clock phases for accurate data recovery. In one exemplary aspect of the invention, for every transition, there is a decision made as to the phase to be selected, in order to enable subsequent related logic to securely latch the data to produce a recovered clock and data signal. Thus, a feature of the present invention is that nearly "instant lock" is provided, as only the first bit of the incoming data stream is lost to achieve pattern lock, while other designs need much more pattern or bits to lock.

The CDR circuit of this invention, therefore, provides recovered clock and data signals with a quasi-fixed phase relationship even though the serial data jitters. Also, as there is no feedback to the VCO or a PLL, the CDR system of the present invention avoids the usual PLL feedback loop problems previously discussed.

The present invention utilizes a plurality of input phases (e.g., 8) of the local clock running at approximately the same nominal frequency of the transmitting clock. The phase offset between successive phases when the number of phases is eight is about 45 degrees. Therefore, the CDR circuit of the current invention may be used in any application where multiple phases offset from one another (e.g., about 45 degrees) of the receiving/sending clock are available (e.g., from a local VCO).

The CDR circuit of the present invention also provides about 2 phase differences (e.g., about 2×260 ps=520 ps) of cycle to cycle jitter tolerance at 480 MHz, which is substantially greater than the 350 ps cycle to cycle jitter tolerance required by USB 2.0, and permits standard ASIC FFs (Flip-Flops) to be used. According to one exemplary aspect of the invention, the incoming data stream may experience frequency wander far greater than specified without causing loss of lock or loss of data. Thus no loss of lock or loss of data circuitry is required. However, if two different frequencies are used in such an exemplary case, a periodic phase shift on the recovered CLOCK_OUT will result. This, in principal, would add to the jitter transfer function of a CDR circuit. However, in any application that provides a deserializer function (serial to parallel conversion), this figure of merit is irrelevant as the deserializer can handle those events using FIFOs.

An advantage of the present invention is that the CDR does not average sample points of the data as most other CDR circuits do. Averaging in CDR circuits is done to avoid the effect of metastable conditions which cannot be avoided in CDRs. The CDR described in accordance with the present invention has an alternative way to handle and eliminate the metastable conditions which avoids averaging and allows fast locking.

Another advantage of the present invention, is that the CDR integrated circuit implementation may be small (e.g., about 300 gates).

Still another advantage of the present invention, is that the CDR solution works well at low and high frequencies of over 480 MHz (multifrequency CDR).

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
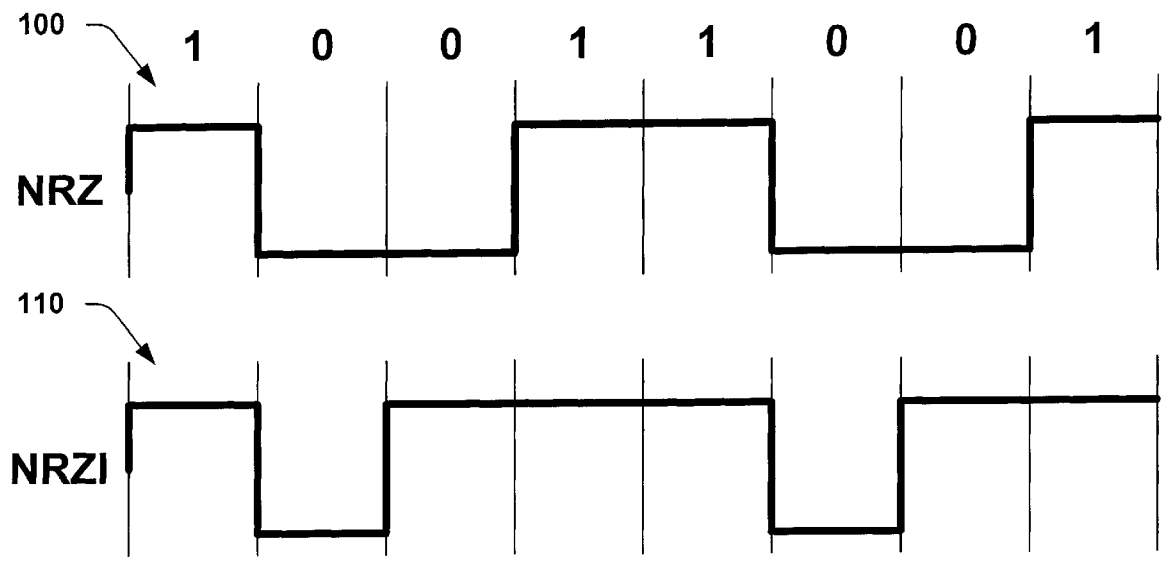
FIG. 1 illustrates a waveform comparison between NRZ and NRZI encoded serial data.
Figure 2:
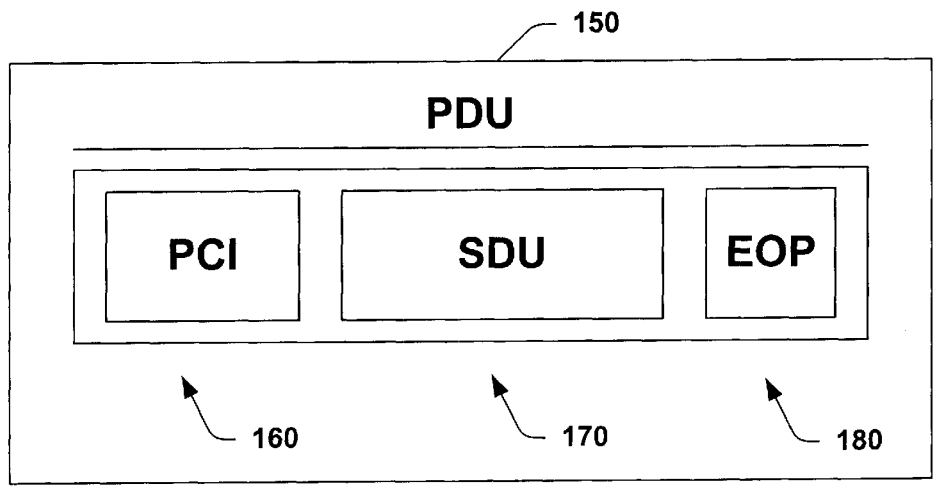
FIG. 2 illustrates a protocol data unit (PDU) and a basic format associated therewith used in packet switching serial data communications.

The present invention will now be described with reference to the drawings, wherein like reference numerals are used to refer to like elements throughout. The present invention relates to a fast locking clock and data recovery system in which a plurality of clock phases and a first logic system are used to detect the particular time within the clock cycle in which a data transition occurs (Phase detection). The CDR system also uses a $2^{nd}$ logic system to determine which of the phases from the $1^{st}$ logic system detected data transition (as more than one phase may have detected a transition, in the case of a metastable condition). The second logic system selects one of the phases, and compares the phase to a previous phase selection associated with a previous data transition, and may change the selected phase in response to the comparison based on predetermined criteria. The CDR system also makes use of a $3^{rd}$ logic system to eliminate metastable conditions of the data transition detections and multiple phase selections. The CDR system also uses a phase selection logic to select one of the plurality of clock phases which is used to securely latch and output a recovered clock and data signal (CLK_OUT, and DATA_OUT). Thus, the present invention provides a fast locking CDR system for producing recovered clock and data signals which are free of metastable conditions with high jitter tolerance for the serial data stream. As this detection and the selection of a valid phase which ideally is centered in the eye of an incoming data stream, takes exactly 1.5 bit times, the first bit is lost while it is available to the second bit on an incoming serial datastream latched at it's eye center.

Figure 3:
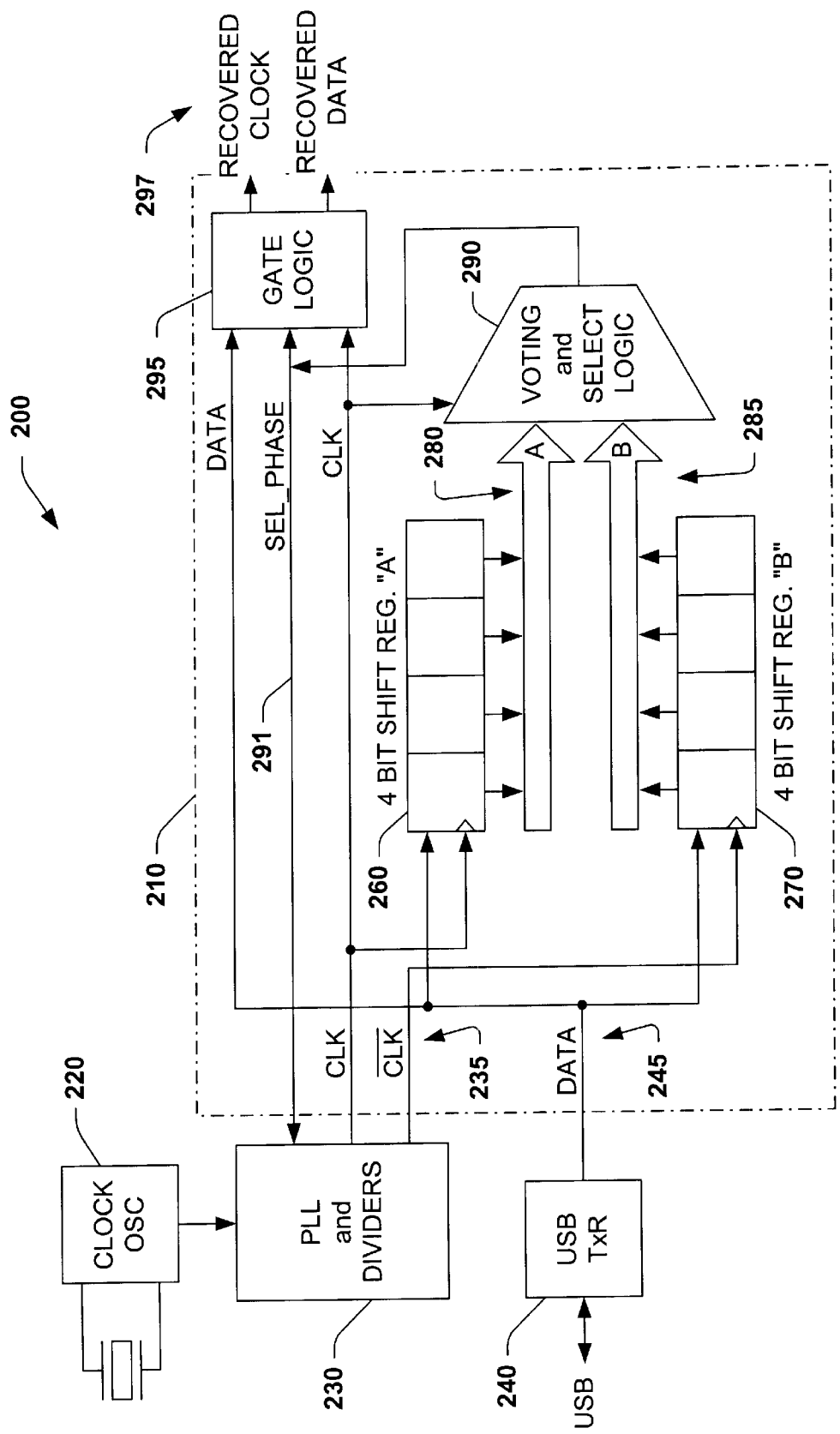
FIG. 3 is a simplified block diagram of a conventional clock and data recovery (CDR) system used in combination with a USB transmitter/receiver to produce recovered clock and data signals.

As previously discussed in regard to FIG. 3, a prior art CDR system required 8 bits of sample point averaging of the data stream (and an associated 8 bit delay) before a clock phase could be determined for latching and recovering data. Averaging in the prior art system CDR system 200 is done to avoid the effect of metastable conditions which in many cases can not be avoided in CDRs because, for example, the initial phase relation of the incoming datastream to the local clock cannot be known. In fact, most conventional CDRs have the constant threat of metastable conditions even after they have locked to the incoming data stream. This leads to false readings and constant frequency and phase updates in their system, causing unnecessary transfer jitter. As was already discussed, a method of eliminating the effect of metastable conditions is averaging (mostly used in plesiochronous systems with slow locking and frequency tracking abilities).

Switching transition time and metastable conditions can not be avoided in CDR systems. The present invention, however, avoids the delay limitation of conventional CDR systems with a method of forcing more (e.g., 8 bits more) information out of each bit cycle, and providing a method of selecting a stable clock phase on the first data transition. Essentially, according to one exemplary aspect of the present invention, the method breaks up a bit cycle into a plurality of smaller time periods with a plurality of clock phases. The clock phases are offset from each other by $(1/N)360°$ of the individual clock phase.

Clock phase offsetting is also found in prior art plesiochronous CDR techniques. However, the main difference lies in the combined phase detection which, according to the present invention, is made resistant to the metastable conditions and voting (phase selection), which does not require multiple bit readings to select a valid output clock phase. Within each of these smaller time periods, a decision is made as to the current state of the serial data stream, wherein the rising edge of each clock phase signal of the plurality of clock phases serves as the trigger-point for the data state decision. The first phase which records a change of state of the data stream, therefore, has recorded a transition which took place in the data stream, and unless a metastable condition is detected, this first phase is used to determine the proper clock phase to lock the data until the next transition occurs. In this way, the determination as to the actual point in time at which the transition took place, is narrowed to within the time period of the offset of a clock phase.

According to one aspect of the current invention, 8 clock phases are used, offset by:

$$(1/N)2\pi=(1/8)2\pi=\pi/4$$

Therefore, according to one aspect of the current invention, the 8 clock phases also resolve the data stream transition to within 1/8 th of the clock cycle and data rate period at 480 Mbps, this is:

$$(1/N)Period=(1/8)(1/480\text{ Mbps})=260\text{ ps}.$$

This means that the data transition may be resolved to within 260 ps even at the USB 2.0 HS (High Speed) data rate of 480 Mbps, and provides a lock on the clock and data occurring 8 times sooner than with the conventional fast locking CDR system illustrated in FIG. 3.

Figure 4:
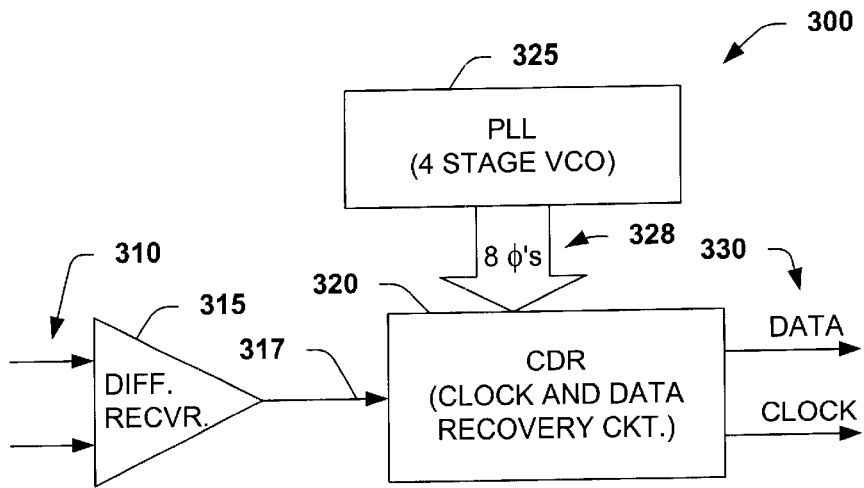
FIG. 4 is a block diagram of an exemplary fast-locking clock and data recovery system used in combination with a differential receiver to produce recovered clock and data signals in accordance with an aspect of the invention.

FIG. 4 illustrates an exemplary CDR system 300, in which several aspects of the current invention may be accomplished. A serial data stream 310 enters a differential receiver (e.g., or transceiver) 315 and outputs a single ended serial data stream 317 into a CDR circuit 320. A 4 stage voltage controlled oscillator (VCO) 325 generates a local clock signal running at approximately the same frequency as the transmitter clock. The 4 stage VCO 325 produces 8 phases 328 of the clock signal which, in this example, are evenly spaced and offset by $\pi/4$ between successive phases, and are supplied to the CDR circuit 320.

Even though 8 phases have been used in this example, it will be apparent to anyone skilled in the art, that any number of phases could be used which may be evenly spaced and offset by $(1/N)\times360°$ between successive phases. According to the present invention, 8 phases works sufficiently with the 350 ps cycle to cycle jitter requirement of USB 2.0. Alternately, 16 phases offset by $\pi/8$ could be used to locate the data transition nearly twice as accurately generating less jitter transfer. However, jitter transfer is not a figure of merit (cannot be measured) for deserializer circuits, as long as integrated serial to parallel conversion accounts for local jitter on the clock signal by holding sufficient FIFO to compensate for singular duty cycle distortions.

The 8 clock phases 328 of the example, together with the single ended data stream 317 are input to the CDR circuit 320 which is operable to detect a 10 data stream transition to within 1/8 th of a clock cycle time, select a phase associated with the transition detection, compare the initially selected phase to a previous phase selection associated with a previous data transition, and make a final phase selection determination based upon the comparison. The phase selection is then used to securely latch and recover the clock and data signals CLOCK & DATA 330, free of metastable conditions and multiple phase selections, and independent of input jitter, as will be discussed in greater detail below.

Figure 5:
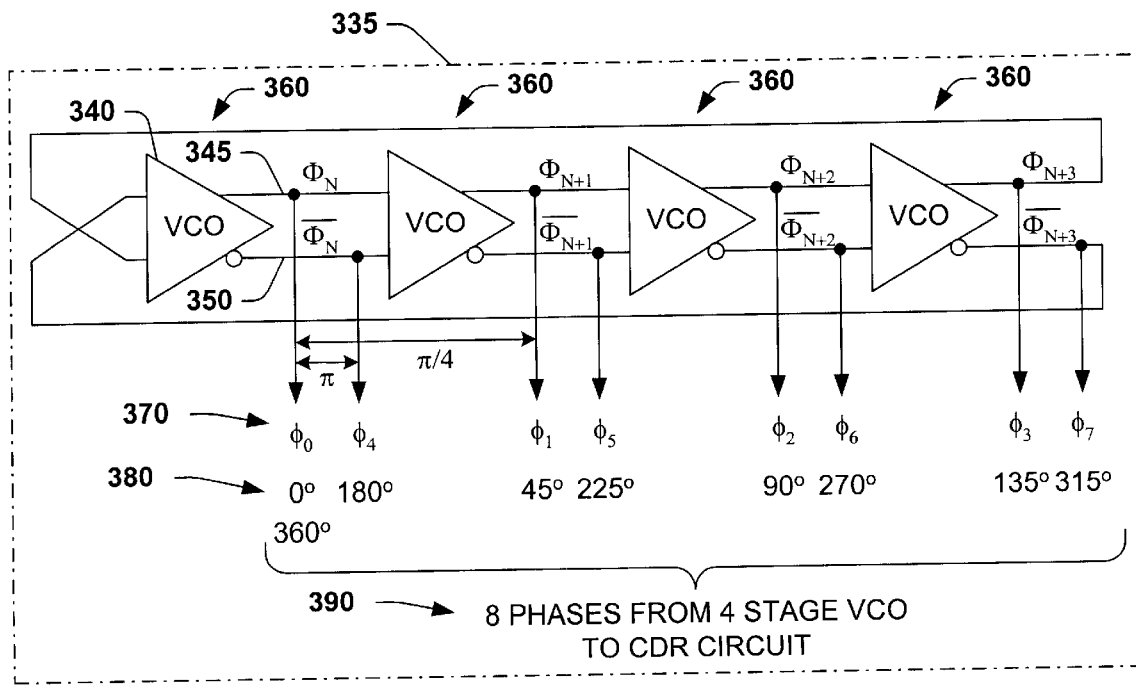
FIG. 5 is a block diagram of an exemplary clock phase generator circuit which may be used to produce multiple clock phases used in the CDR system of FIG. 4 in accordance with an aspect of the invention.

FIG. 5 is an exemplary implementation 335 of the 4 stage VCO circuit of FIG. 4. A VCO 340 generates a local clock signal running at approximately the same frequency as the transmitted clock, and outputs a CLK 345 & CLK(NOT) 350 signal ($\Phi_N$–$\Phi_N$ (NOT)) forming a VCO stage 360, which feeds 3 other successive VCO stages 360. The final VCO stage feeds back to the first VCO stage to produce 8 phases 370 ($\Phi_0$–$\Phi_7$) derived from the clock signals 345 & 350, whereby the 8 phases are evenly spaced and offset by $\pi/4$ (380) between successively numbered phases 370. The phase difference between $\Phi_N$ to $\Phi_N$ (NOT) is, in the example, $\pi$ or 180°. The phase difference between $\Phi_N$ to $\Phi_{N+1}$ is, in the example, $\pi/4$ or 45°.

The 4 stage VCO comprises a plurality (e.g., 4) of VCO stages 360 individually adapted to receive the CLK & CLK(NOT) signals 345 & 350 respectively, and produce a CLK & CLK(NOT) (inverted CLK) for each of the individual VCO stages 360. FIG. 5 also illustrates 8 clock phases 370, evenly spaced and offset by $\pi/4$ (45°) (380) between successively numbered phases 370. With 8 clock phases 370 ($\Phi_0$–$\Phi_7$) running at 480 MHz, the phase to phase offset 380, is ~260 ps. The 8 phases are coupled from the 4 stage VCO to the CDR circuit as designated at reference numeral 390.

Figure 6:
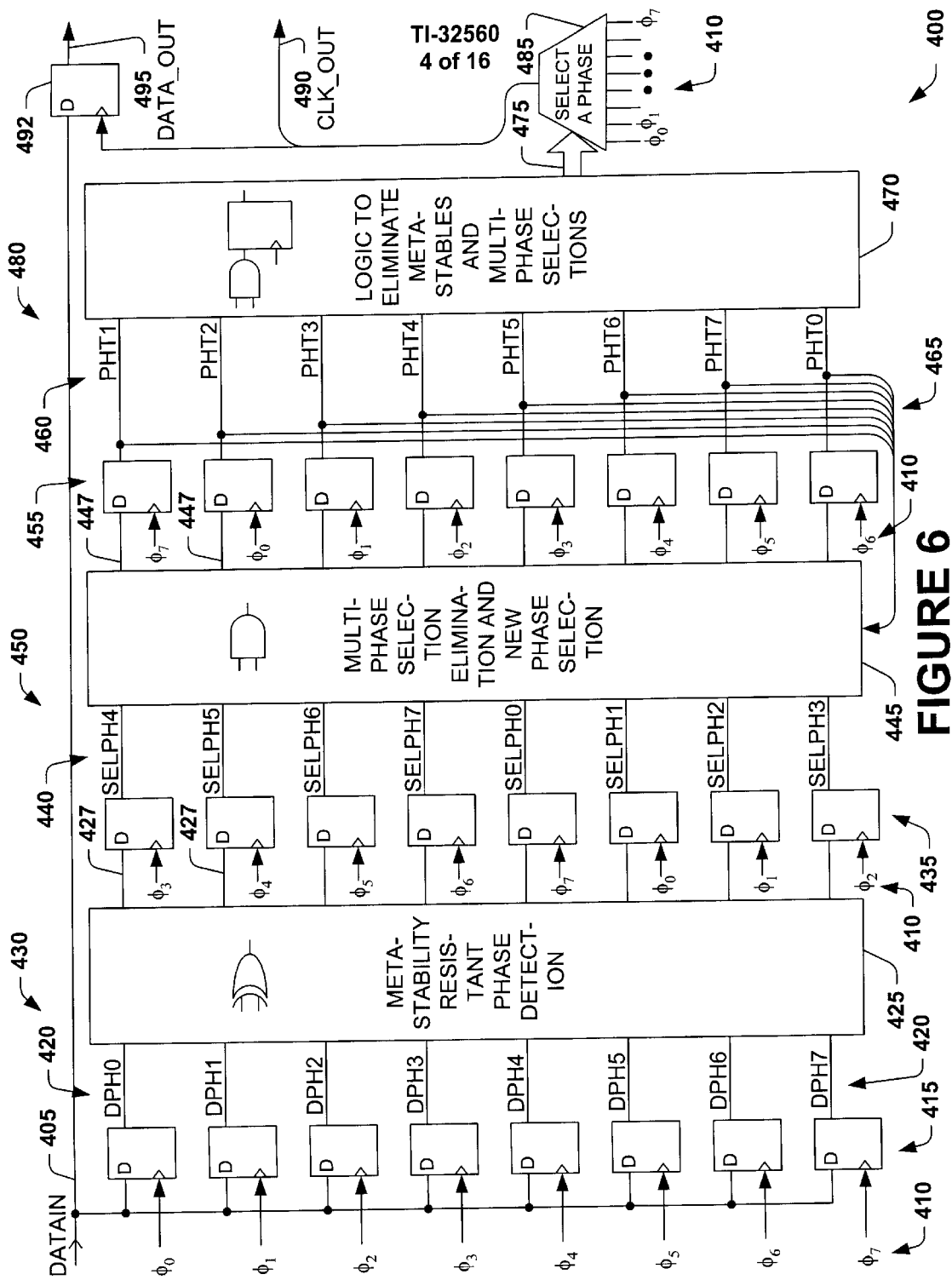
FIG. 6 is a simplified block diagram of an exemplary fast-locking CDR circuit wherein clock and data signals may be recovered from a serial data stream, in which various aspects of the invention may be carried out.

FIG. 6 illustrates an exemplary CDR circuit 400, in which several aspects of the current invention may be accomplished. The CDR circuit 400 is operable to receive a single ended serial data stream 405, and 8 phases 410 of the local clock signal which are evenly spaced by 45° (π/4) between successive phases.

In one exemplary aspect of the present invention, the CDR circuit comprises: a $1^{st}$ logic system 430 which is operable to receive the single ended serial data stream 405, and the plurality of clock phases 410, and detect whether a transition of the data stream took place corresponding with one or between two of the plurality of clock phases 410. The $1^{st}$ logic system is further operable to generate a plurality of data signals (each separated by PHI/4 in the time domain) corresponding to the data transition detection 427 based upon the serial data stream 405.

The CDR circuit 400 further comprises a $2^{nd}$ logic system 450 which is operable to receive the plurality of data transition detections 427, a plurality of clock phases 410, and a plurality of previous clock phase selections 465, to determine which phase corresponds to the current data transition. The $2^{nd}$ logic system 450 is further operable to compare the new data transition to the clock phase selection associated with the previous data transition, and generate a plurality of phase determinations 447 based upon the comparison.

The CDR circuit 400 of FIG. 6 further comprises a $3^{rd}$ logic system 480 which is operable to resolve any metastable conditions and/or multiphase selections associated with the clock phase determination, for example, 447, by applying amplification, hysteresis and feedback to generate a plurality of processed phase selections 475 based upon the plurality of phase selections 447.

Lastly, the CDR circuit 400 comprises a phase selection logic circuit 485 operable receive the plurality of clock phase signals 410, and to select one of the plurality of clock phase signals 410 based on the plurality of processed phase selections 475, as the best phase selection 490. The best phase selection 490 is then used to securely latch 492 and recover the data signal DATA_OUT 495, whereby the recovered clock and data signals are free of metastable conditions and multiple phase selections.

In another aspect of the present invention, the $1^{st}$ logic system 430 of the CDR circuit of FIG. 6 (see also FIG. 7 for further circuit details) comprises: a $1^{st}$ latch 415(515), comprising a plurality of D-FFs individually adapted to receive the serial data stream 405(505), and the plurality of clock phase signals 410(510). The logical state of the data stream is latched by the plurality of D-FFs at, for example, the rising edge of each clock phase of the plurality of clock phase signals 410(510), and serves as a trigger point for a data state indication 420 at each of the plurality of D-FFs.

The $1^{st}$ logic system 430 further comprises a $1^{st}$ logic component 425(525 & 527), comprising a plurality of exclusive-OR (EX-OR) gates 525 and OR gates 527 adapted to receive the plurality of data state indications 420(520) from the $1^{st}$ latch 415(515), and generate a plurality of data transition determinations 440(540). The EX-OR gates compare the outputs of 2 D-FFs. In case there was a data transition at a time at, or between two adjacent phases latching the data, the output of the EX-OR would be logic HIGH. To avoid the impact of metastable conditions of one (there can be only one at a time) of the D-FFs, not only DPH(N) is compared to DPH(N+1) and DPH(N−1) but also to DPH(N+2) and DPH(N−2). When OR'ing the results of the EX-ORs, there is always a valid result at the outputs of the OR gates. This result can be either a single logic one, or up to 3 logic ones (adjacent) at the time the outputs of the OR gates get latched into the second column of D-FFs 535. This would cause a multiphase selection which is taken care of later.

Figure 7:
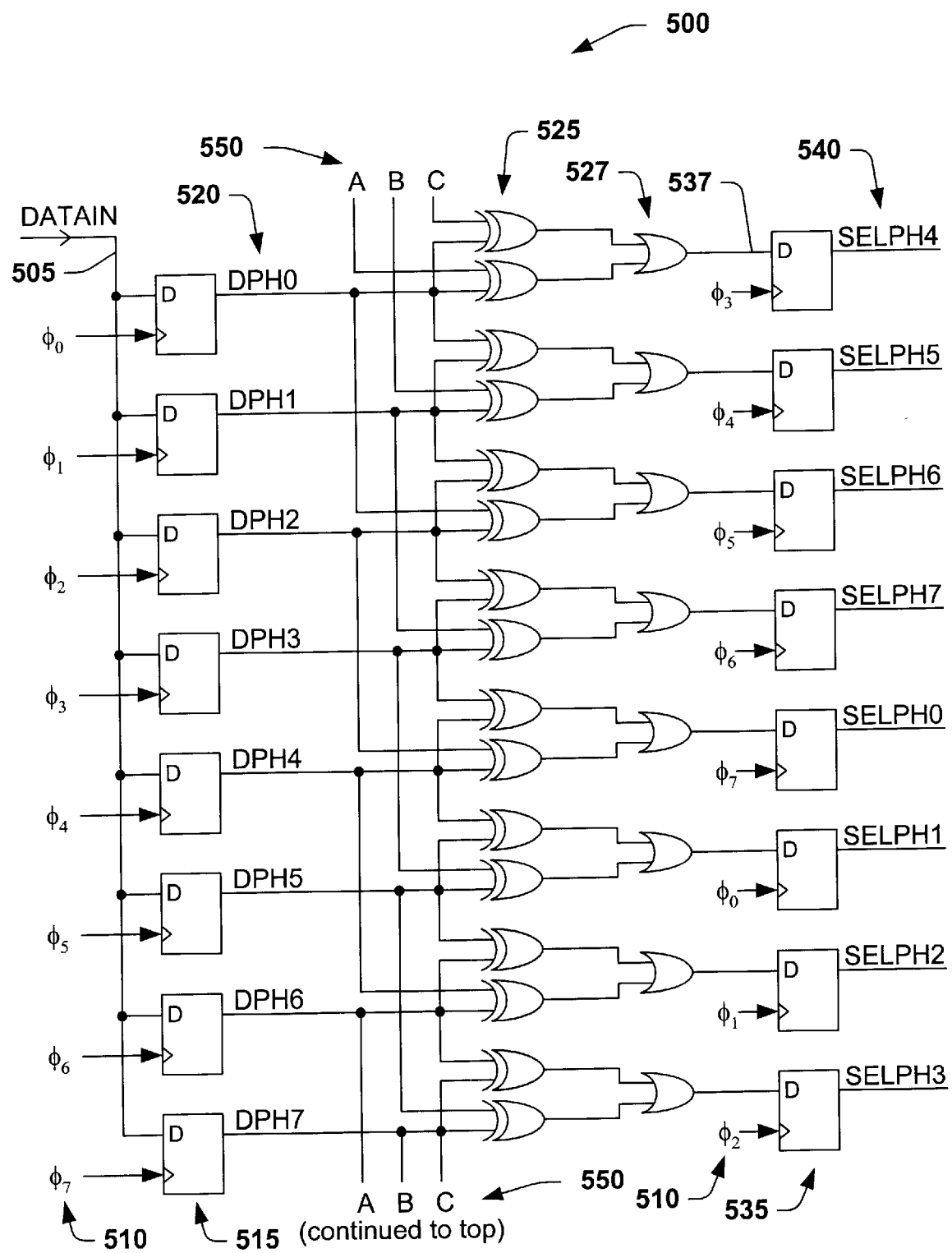
FIG. 7 is a schematic illustration of an exemplary $1^{st}$ logic circuit and a $2^{nd}$ latch, wherein a transition of the data stream may be detected and the transition detection latched in accordance with an aspect of the invention.

FIG. 7 illustrates further exemplary circuit details of the $1^{st}$ logic system 500, corresponding to the $1^{st}$ logic system 430 of FIG. 6, plus a $2^{nd}$ latch 535, corresponding to the $2^{nd}$ latch 435 of FIG. 6. DPH0 thru DPH7 520 illustrate the data state signals which are latched by the positive going edge of the associated clock phase signals 510. As the phases are offset, in the 8 phase example by 45°, triggering of the D-FFs 515 by the 8 phases 510 will ripple downward thru the 8 FFs of the $1^{st}$ latch 515, and repeat back to the top FF on a continuous basis. For this reason, the labels A, B, & C (550) illustrate interconnections from the bottom of the schematic to the top.

Thus, it becomes apparent from FIG. 7 that the data transition determination, and ultimate phase selection process of the present invention is an ongoing, continuous process that yields a new phase selection (or at least a determination to stay with the last phase selection) on every data transition. Therefore, faster and tighter lock control is achieved, while eliminating metastable conditions with every data transition, and providing recovered clock and data signals independent of a cycle to cycle data stream jitter of up to 0.25 UI and frequency wander. This nearly instant lock feature, means that only the first bit is lost, whereas conventional CDRs require substantially more pattern to lock.

The plurality of transition detection signals, SELPH4 thru SELPH3 (540) are latched by triggering the $2^{nd}$ latch FFs 535 with the plurality of clock phase signals Φ3 thru Φ2 (510). So, in the same way as the $1^{st}$ latch 515, the $2^{nd}$ latch 535 is continuously updated with new transition detection signals 540 for the phase selection process which continuously yields recovered clock signals.

Figure 8:
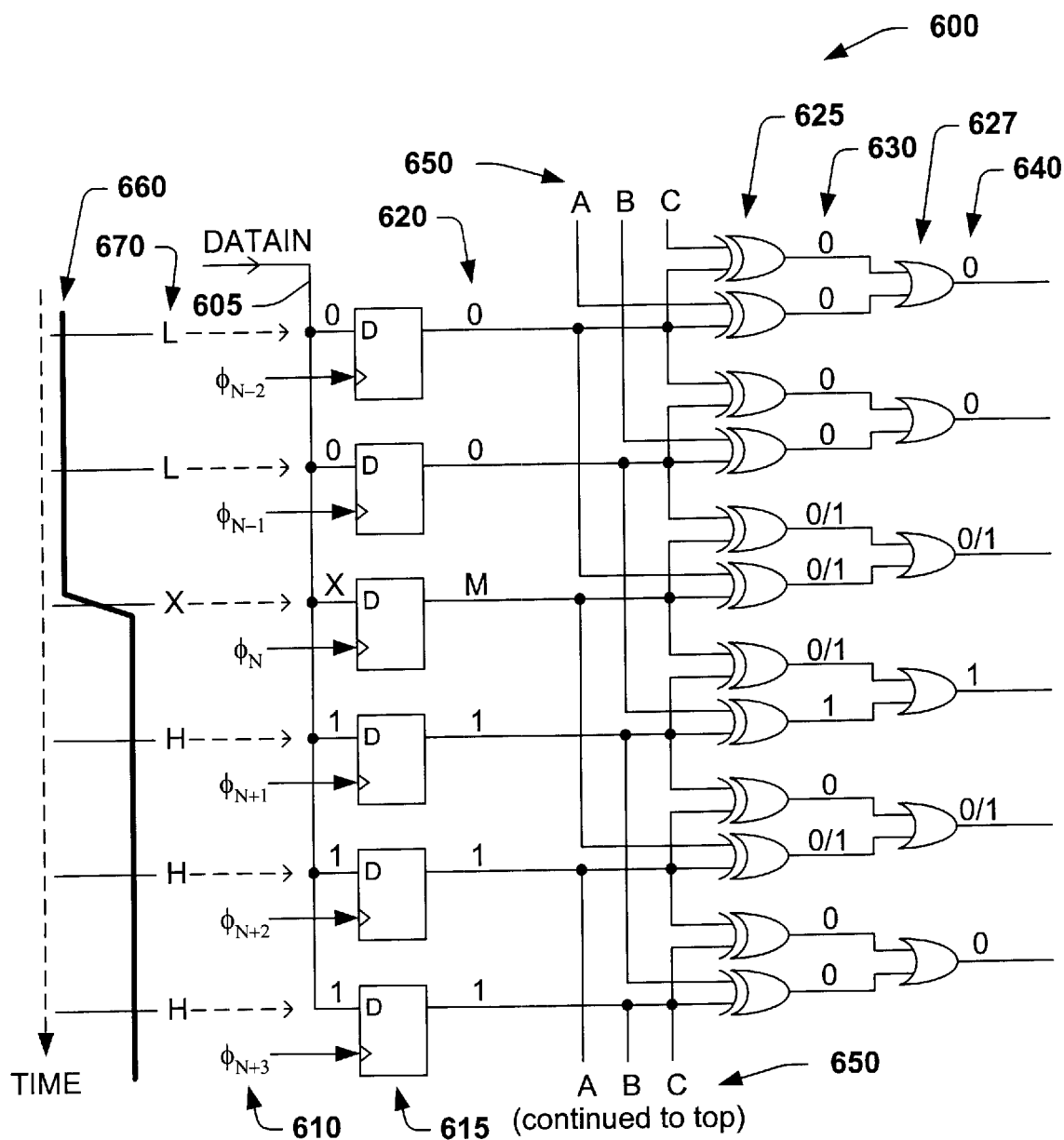
FIG. 8 is a partial schematic illustration of the exemplary $1^{st}$ logic circuit of FIG. 7 and a portion of a data stream signal waveform, wherein the transition detection of the data stream is indeterminate at clock phase N, which may produce a metastable condition in a FF.

FIG. 8 is a partial schematic illustration 600 of an exemplary $1^{st}$ logic circuit 500 of FIG. 7 and a portion of a data stream signal waveform 660, wherein in the illustrated example the transition detection of the data stream 660 is indeterminate at clock phase N. When a data transition occurs coincident with the rising edge of a clock phase signal $\Phi_N$, a metastable condition may be produced in the associated FF, wherein the state of the FF has not yet settled on one state or another. That is, when the switching transition period of the FF data occurs coincident with the rising edge trigger of its respective clock phase signal $\Phi_N$, a metastable condition may take place in the associated FF. This condition may manifest itself as a reduced amplitude signal (A.K.A. a runt signal), or as an indeterminate delayed logic state (1 or 0). Thus, a runt signal, or an indeterminate logical state produces a metastable condition "M" in successive logic circuits.

Figure 19:
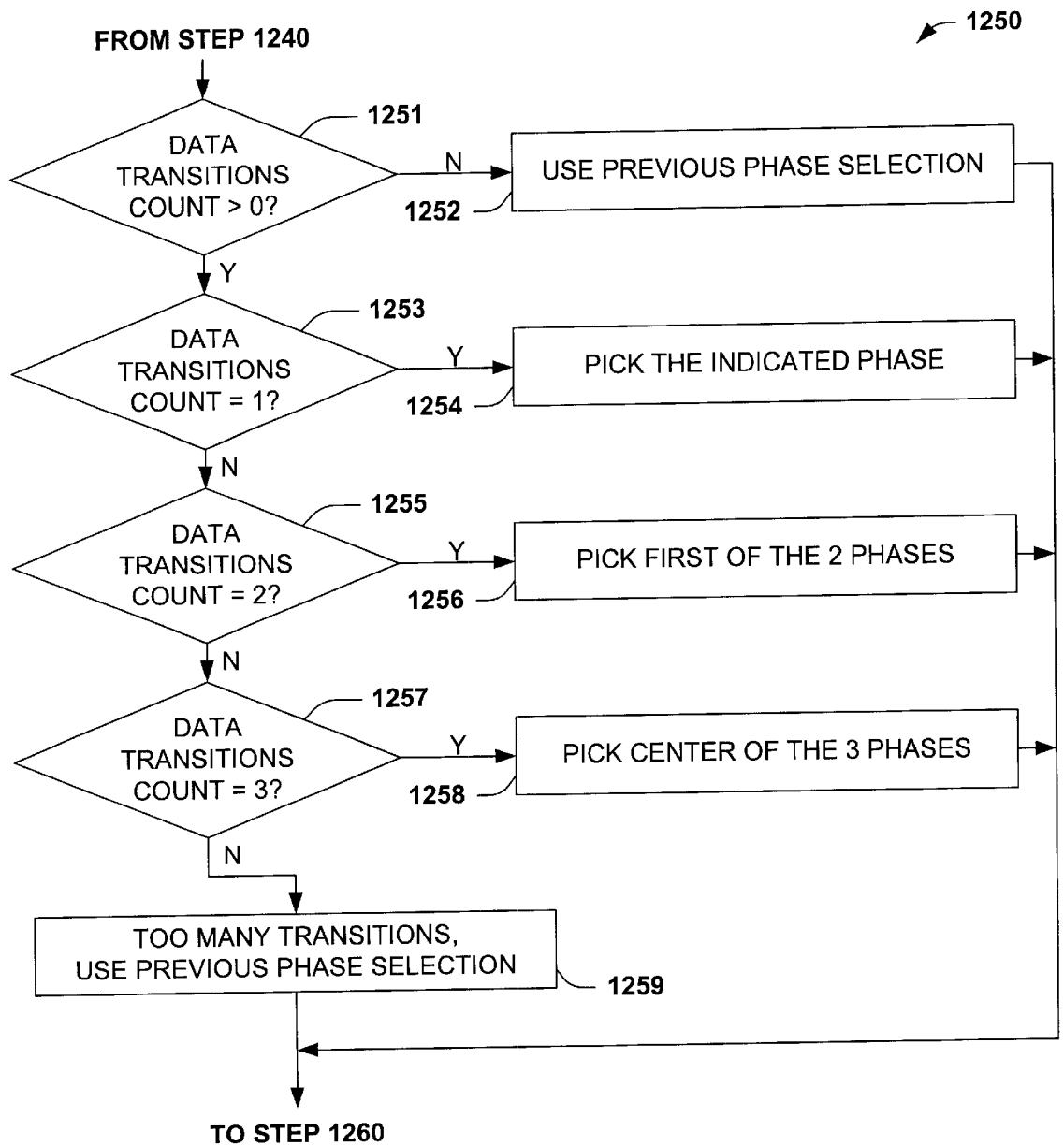
FIG. 19 is a partial flow diagram illustrating an exemplary method for the data transition detection quantity determination and phase selection step 1250 of FIG. 17 for the fast locking clock data recovery operation in association with an aspect of the present invention.

FIG. 8 also illustrates the logical state 670 of the data stream 660 and the resultant $1^{st}$ latch logical state 620 which was latched into the $1^{st}$ latch 615 via the clock phases ($\Phi_{N-2}$–$\Phi_{N+3}$). In this example, the $1^{st}$ latch 615 logical states 620, illustrate a worse case situation with one metastable state "M", and three "1" states latched. The metastable state "M" is also displayed as 0/1 in 630 and 640 to indicate that either a "0" or a "1" may result on the output of the data transition determinations 640. Fortunately, the data state condition usually results in only 1 or 2 "1" states produced at the transition determinations 640. For a preview, FIG. 19 shows how up to 3 data transitions are processed according to one aspect of the invention, by the $2^{nd}$ logic system (450 of FIG. 6). Therefore the first logic circuit 500, 600 detects when the input data stream 405, 505, 605 experiences a data transition by the logical state of the transition determination 640 of FIG. 8.

Figure 9:
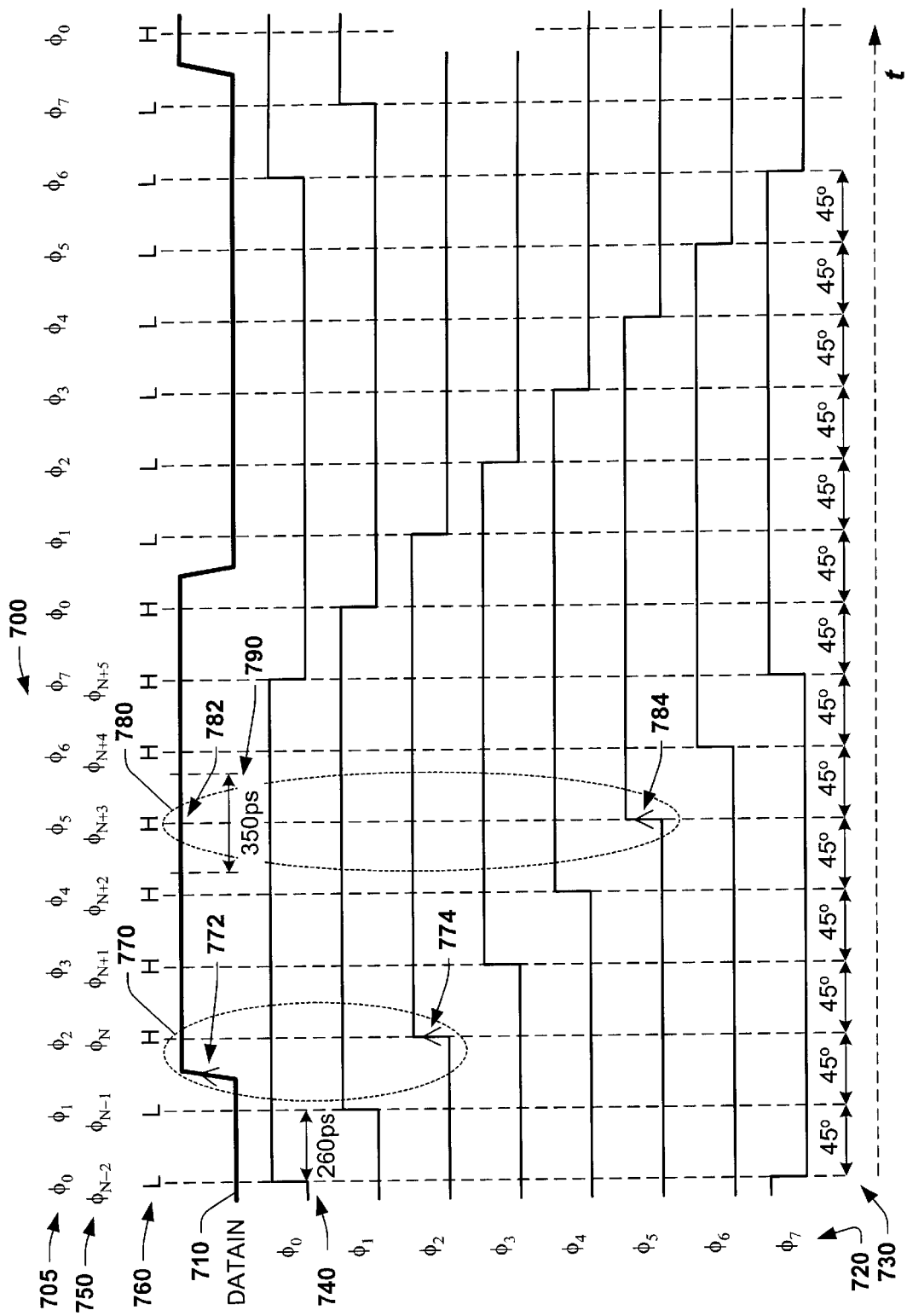
FIG. 9 is a simplified timing diagram illustrating exemplary CDR circuit data transition detection timings relative to the detecting phase N and the selected phase N+3 in which various aspects of the invention may be carried out.

FIG. 9 is a simplified timing diagram 700 illustrating exemplary CDR circuit data transition detection timings relative to the detecting phase $\Phi_N$ area (770) and the selected phase $\Phi_{N+3}$ area (780) in which various aspects of the invention may be carried out. A plurality of clock phases timings ($\Phi_0$–$\Phi_7$) 705 are illustrated across the top continuously repeating, and clock phases signals ($\Phi_0$–$\Phi_7$) 720 are shown down the left side of the timing diagram. At the rising edge of the clock phases signals ($\Phi_0$–$\Phi_7$) 720, the associated clock phase timing ($\Phi_0$–$\Phi_7$) 705 is indicated. The clock phases as they relate to the detecting phase $\Phi_N$ are illustrated by the second row of phase indications ($\Phi_{N-2}$–$\Phi_{N+5}$) 750. The input data stream DATAIN 710, and associated logical states 760 in this present example, illustrate a positive going data transition 772 occurring after phase timing $\Phi_1$, but just before phase timing $\Phi_2$. Thus, the rising edge 774 of $\Phi_2$ triggers its associated FF to latch the first "1" state of the data 710, and $\Phi_2$ is identified as the detecting phase $\Phi_N$ (750). The 45° phase offsets 730 between successive phases are illustrated at the bottom of the diagram along with the associated offset time of 260 ps (reference numeral 740) at 480 MHz.

Referring back to FIG. 6, it should be noted that there are intentional phase offsets placed between the $1^{st}$ latch 415 and the $2^{nd}$ latch 435, as well as between the $2^{nd}$ latch 435 and the $3^{rd}$ latch 455. Note that the first (top) FF of the $1^{st}$ latch 415 uses $\Phi_0$ to trigger the FF, while the first (top) FF of the $2^{nd}$ latch 435 is triggered by $\Phi_3$, and the first (top) FF of the $3^{rd}$ latch 455 is triggered by $\Phi_7$. Thus, a 3 phase offset is used between the $1^{st}$ and $2^{nd}$ latch, and a 4 phase offset is used between the $2^{nd}$ and $3^{rd}$ latch. Now, referring back again to FIG. 9, the reason for these offsets will become more apparent. $\Phi_2$ just became the detecting phase $\Phi_N$ (750), as the first phase to record a "1" state of the data 710. However, $\Phi_2$ should not be selected as the phase to latch DATAIN 710, as this phase is, by definition, very close to the data transition. If $\Phi_2$ were used, any data jitter which occurs, may cause data to be lost. $\Phi_5$ 705 however, which is also $\Phi_{N+3}$ 750 (within 780), occurs close to the middle of the positive half of the DATAIN waveform. Therefore, $\Phi_5$ 705 becomes a much better choice with a 3 phase offset from $\Phi_2$ to $\Phi_5$. In this way, any jitter 790 which may occur will not cause the "1" state indication to change in the middle of the waveform (AKA "eye-opening").

Statistically the offset between the detected data transition and the mid-point of the data waveform would be 4 phase offsets, however, as it takes a while to calculate which phase should be used, the offset can not be set too short. The shorter the time to calculate the right phase, the better, as there could be a jitter event anytime. If the clock is not adjusted before this occurs, a bit may be lost. In order to keep the time to calculate the resulting clock phase short, it was decided by the inventor, to use a shorter 3 phase offset between the first two latches, and the 4 phase offset between the second pair of latches, to account for the calculation time. The clock phase chosen needs to be close enough to the data transition to keep the time short, but close enough to the middle of the waveform to be independent of jitter.

With this method, the CDR system of the present invention, does not need multiple transitions of DATAIN 710 to select a clock phase, providing a nearly "instant lock", with recovered CLK_OUT, and DATA_OUT signals that have a fixed phase relationship with the local clock even though DATAIN jitters.

Figure 10:
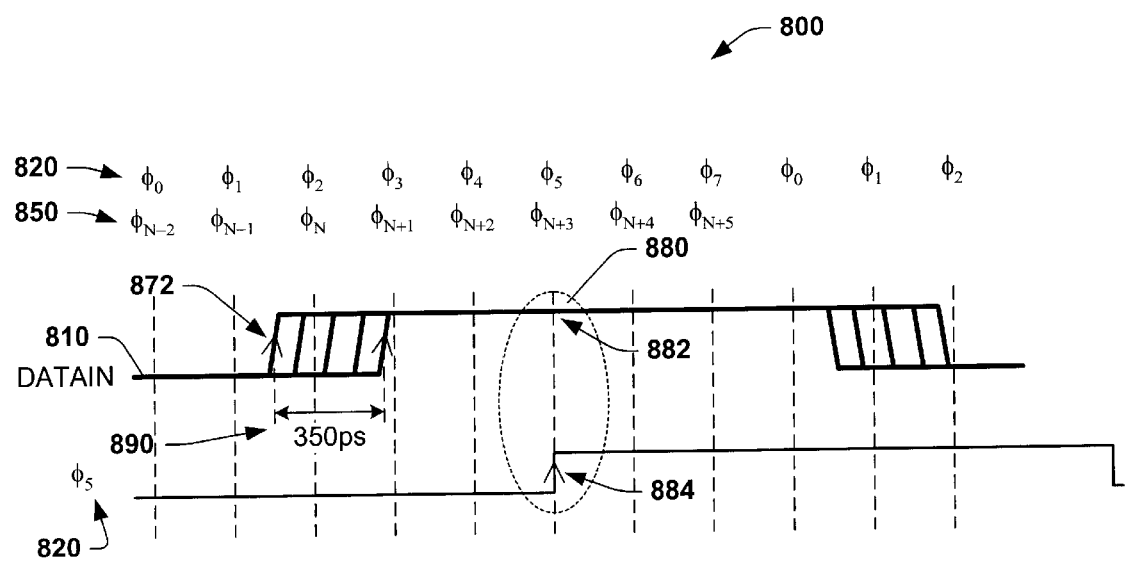
FIG. 10 is a simplified timing diagram illustrating an effect of 350 ps of data jitter in exemplary CDR circuit data transition detection timings relative to a selection of a phase in accordance with an aspect of the invention.

FIG. 10 is a simplified timing diagram 800 illustrating the effect of 350 ps of data jitter in the exemplary CDR circuit data transition detection timings relative to the selection of a phase in accordance with an aspect of the invention. As with FIG. 9, a plurality of exemplary clock phases timings ($\Phi_0$–$\Phi_7$) 820 are illustrated across the top in a continuously repeating manner. The clock phases s they relate to the detecting phase $\Phi_N$ are illustrated by the second row of phase indications ($\Phi_{N-2}$–$\Phi_{N+5}$) 850. The input data stream DATAIN 810, illustrate a positive going data transition 872 occurring after phase timing $\Phi_1$, but just before phase timing $\Phi_3$. In FIG. 9, the rising edge 774 of $\Phi_2$ triggers its associated FF to latch the first "1" state, and $\Phi_2$ becomes the detecting phase $\Phi_N$ (750). However, with the 350 ps of jitter 890 possible at the leading edge 872 of DATAIN 810, $\Phi_2$, or $\Phi_3$ may become the detecting phase $\Phi_N$. Once again, this illustrates the need for offsetting the selection phase to $\Phi_5$ ($\Phi_{N+3}$) viewed in area of interest 880 with the rising edge 884 of $\Phi_5$. Thus, $\Phi_5$ is close enough to the middle 882 of the positive half of the DATAIN 810 waveform to keep the recovered clock and data signals independent of jitter 890 which may reside within the serial input data.

Returning briefly to FIG. 6, recall that the second logic system 450 is operable to receive signals 427 which indicate the transition of the serial input data 405 and latches the stat of the signal 427 via the second latch 435, to generate data transition determination signals SELPH4–SELPH3 440. A second logic component 445 uses the data transition determination signals 440 to ascertain or determine the phase associated with the data transition and then consequently selects an initial clock phase that will lie in the "sweet spot" of the data based on the determination, as illustrated in FIG. 10. In addition, the second logic component 445 is operable to compare the initial clock phase to a final clock phase associated with the previous data transition via a data feed back 465, as illustrated in FIG. 6. In that manner if the new initial selected clock phase differs from the previous clock phase too much, a modification of the initial selected clock phase may be made.

Figure 11:
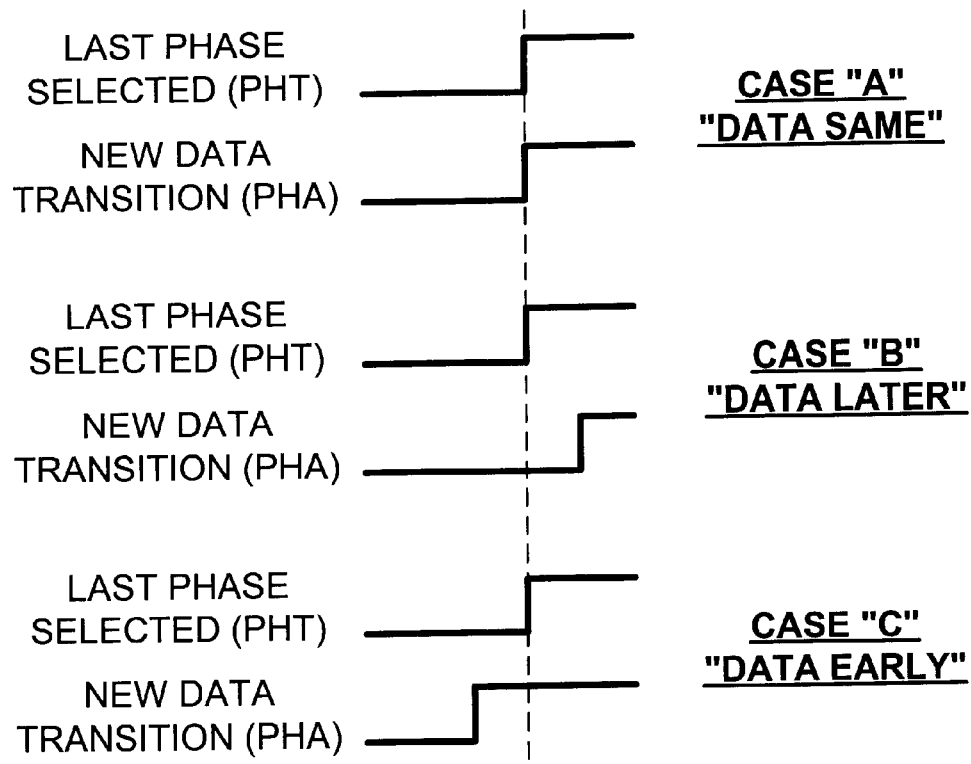
FIG. 11 illustrates three waveform comparison cases of the CDR $2^{nd}$ logic component for comparing the last phase selection to the new data transition detected, in accordance with an aspect of the invention.

FIG. 11 illustrates three waveform comparison cases of the CDR $2^{nd}$ logic component for comparing the last or previous phase selection to the new initial clock phase selection associated with the data transition, in accordance with an aspect of the invention.

Figure 20:
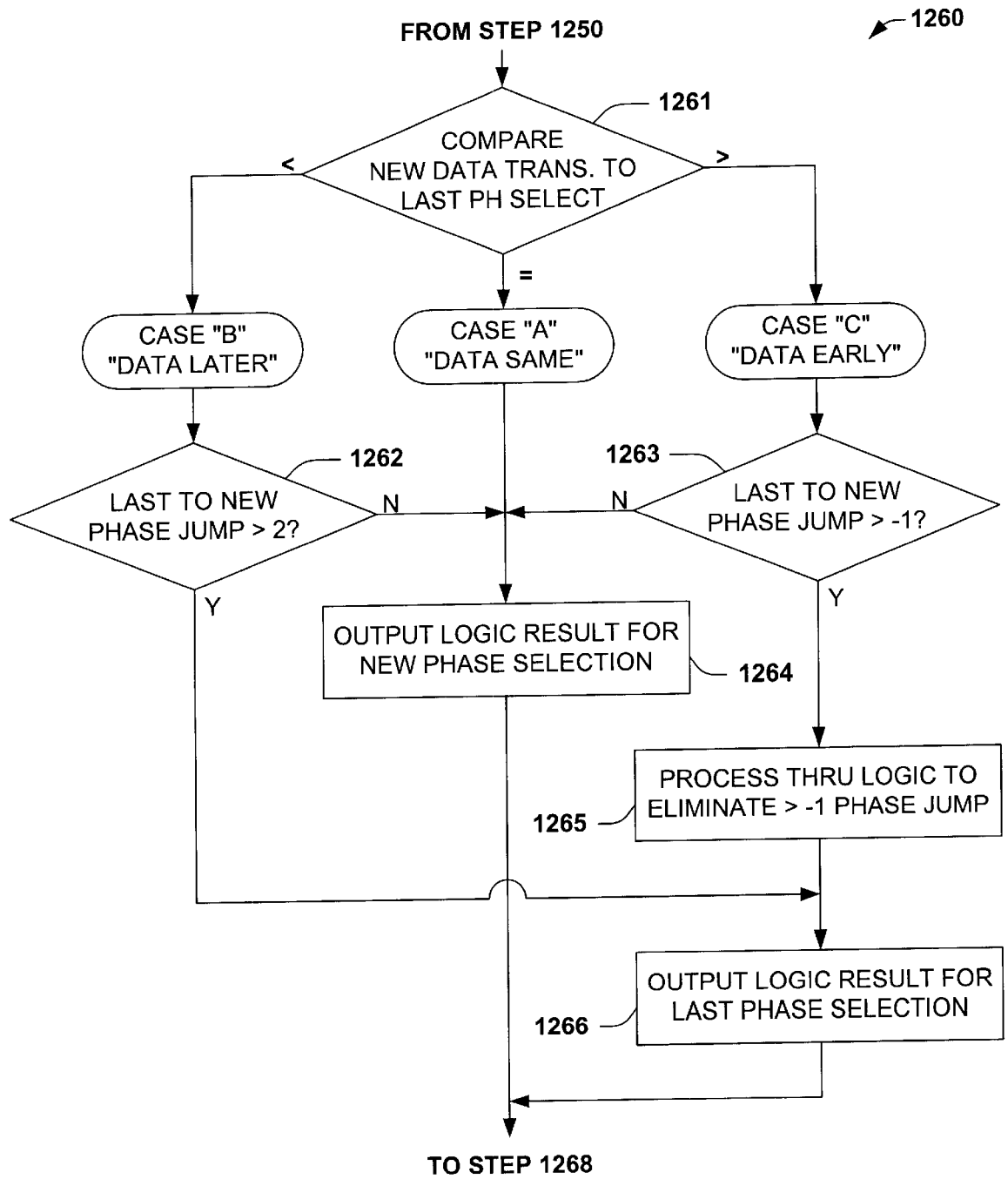
FIG. 20 is a partial flow diagram illustrating an exemplary method for the data transition detection comparison to last phase selection step 1250 of FIG. 17 for the fast locking clock data recovery operation in association with an aspect of the present invention.

FIG. 11 illustrates the three exemplary case comparisons A, B, & C, which represent one of the two logic tasks which are accomplished by the $2^{nd}$ logic component 445. That is, FIG. 11 illustrates the comparison that is made regarding the initial phase selection and a previous selection. The other task is to determine the number of data transitions identified by the $2^{nd}$ latch. Exemplary methods of implementing both of these tasks are shown in FIGS. 19 & 20 and will be discussed in greater detail later.

Case A of FIG. 11 illustrates a comparison which is made in the CDR $2^{nd}$ logic component (445 of FIG. 6). If a new data (PHA) transition is found to occur at the same time as the last phase selection (PHT) (i.e. "Data Same"), then the initial clock phase determination matches the previous clock phase and a decision is made to select that same phase.

Case B of FIG. 11 asks if a clock phase associated with the new data (PHA) transition is found to occur later than the last phase selection (PHT) (i.e. "Data Later"), then a decision is made to select the new phase as long as the phase jump is not more than 2 phase offsets (90°, or ≅520 ps @ 480 MHz). If however, the new data transition is offset by more than 2 phase offsets, a decision is made to use the previous phase selection as the new phase selection.

Case C of FIG. 11 asks if a clock phase associated with the new data (PHA) transition is found to occur before the last phase selection (PHT) (i.e. "Data Early"), then a decision is made to select the new phase as long as the phase jump is not more than 1 phase offset (45°, or ≅260 ps @ 480

MHz). If the phase jump is phase offset greater than −1, data could be lost as the clock cycle CLK_OUT would be too short. In this case of a phase jump greater than −1, an extra logic circuit in the $2^{nd}$ logic component 445 is provided to prevent this action, which results in a decision to use the last phase selection as the new phase selection.

Figure 12:
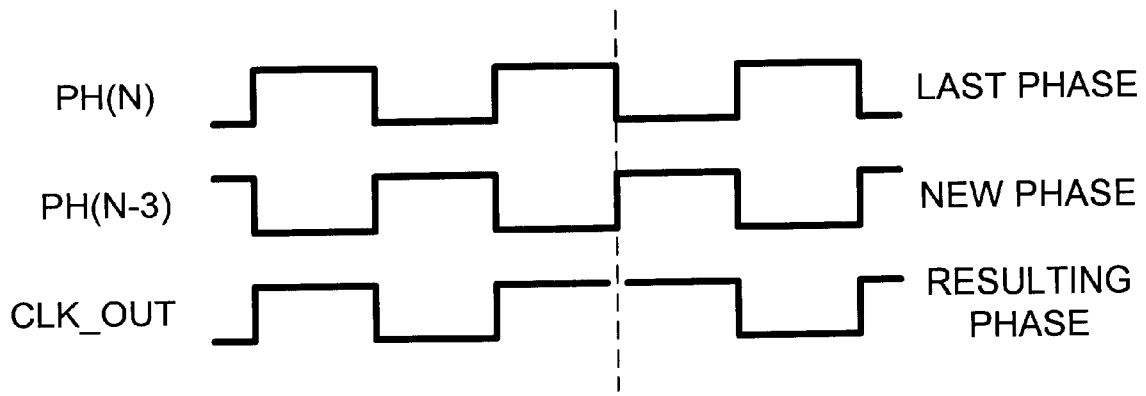
FIG. 12 illustrates a comparison of waveforms for the case of the CDR $2^{nd}$ logic component when the new phase selection jumps (lags) the last phase selection by greater than N−2, in accordance with an aspect of the invention.

FIG. 12 illustrates a comparison of waveforms for the Case C ("Data Early") of the CDR $2^{nd}$ logic component when the new data (PHA) transition selection jumps (lags) the last phase selection by greater than N−1, in accordance with an aspect of the invention, and shown in the exemplary method of FIG. 20 at steps 1262 & 1264. If a phase jump of greater than −1 were allowed to take place, FIG. 12 shows what would take place. Namely, at a phase jump of −2, a much too short 1.5 ns cycle would result, while at a phase jump of −3, a complete cycle would be lost. Thus, additional logic is provided to eliminate this condition.

Figure 13:
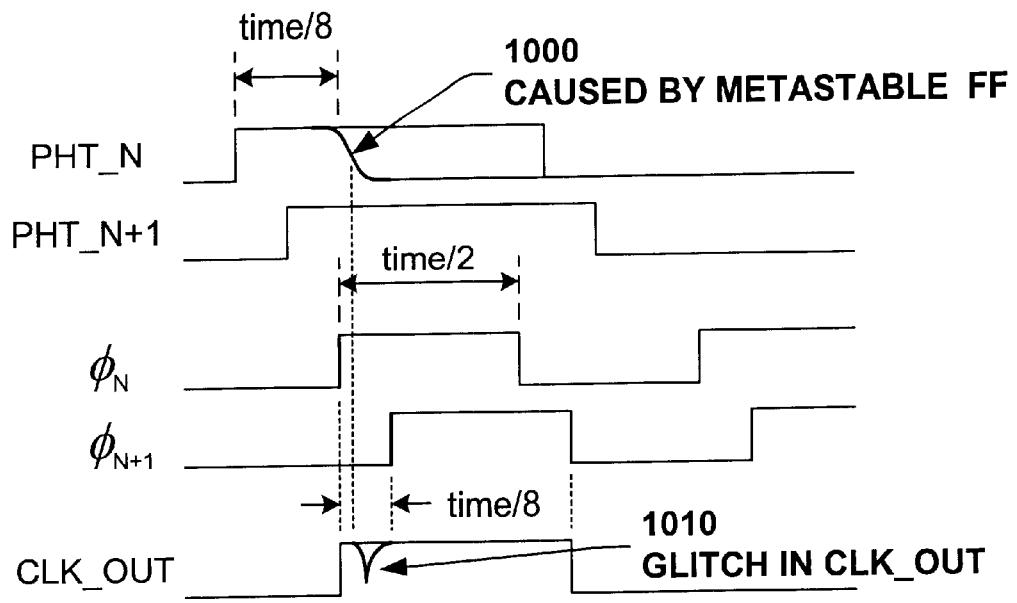
FIG. 13 is a simplified timing diagram illustrating a source of a potential metastable condition in a FF, and the resulting glitch which may be produced in the CLK_OUT signal in an exemplary CDR circuit.

FIG. 13 is a simplified timing diagram illustrating the source of a potential metastable condition in a FF, and the resulting glitch which may be produced in the CLK_OUT signal in an exemplary CDR circuit as a result thereof. Metastability is the condition of a set of logic, particularly a FF, during which the logical output state is indeterminate as to a "0" or a "1" for some period of time. In other words, the output of a logic device may be unstable, or have only a slight margin of stability. PHT_N represents a signal input to a FF, and $\Phi_N$ attempting to trigger the FF. If PHT_N happens to be transitioning 1000 to a low state at just the right moment when $\Phi_N$ attempts to trigger the FF, a metastable condition may occur in the output of the FF as shown by the CLK_OUT signal, and produce a glitch 1010 or a low amplitude (runt) signal output. If the output signal amplitude is too low, or the glitch makes the signal time too short, then the next phase PHT_N+1 will take over the final clock phase selection. In this case, PHASE_N would be selected for only the time PHT_N is active, and when it has died out, PHASE_N+1 would be selected by the PHT_N+1. There is a very short period of time when this condition is actually true (e.g., pico seconds) but, the risk is there.

Figure 14:
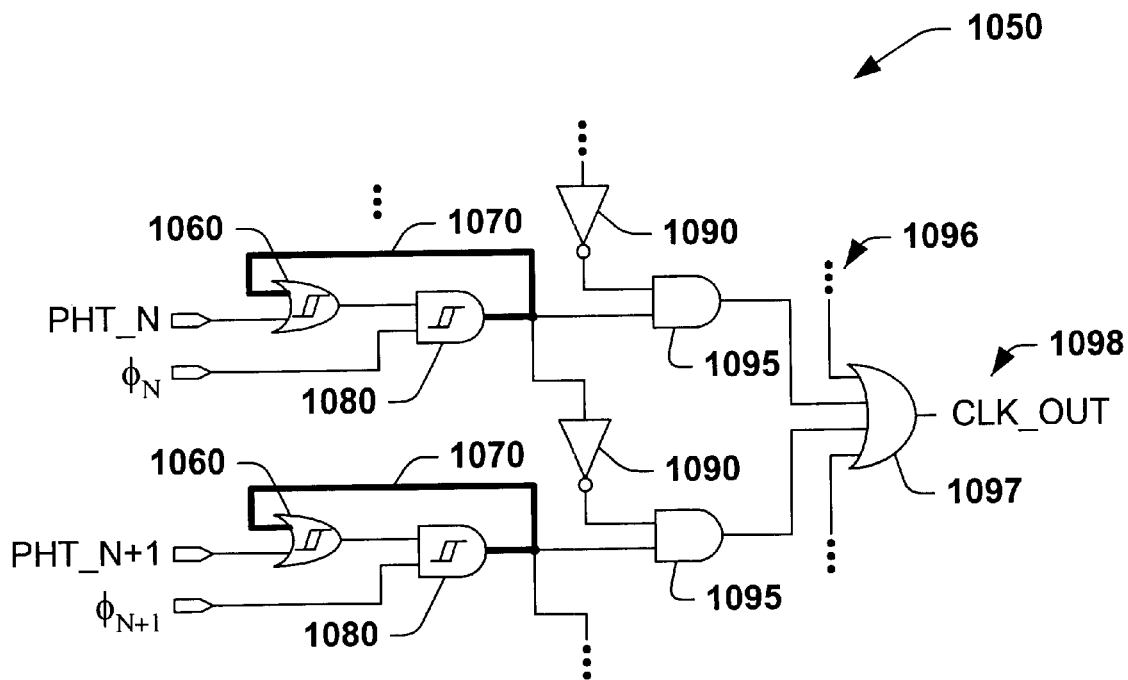
FIG. 14 is a simplified schematic illustration of an exemplary CDR $3^{rd}$ logic component "hold and disable next phase" circuit solution for the metastable condition of FIG. 13, intended for elimination of metastable conditions and multiple phase selections by disabling the next phase, in accordance with another aspect of the invention.

The present invention resolves the above problem with another exemplary circuit, as illustrated in FIG. 14 (1050). In the circuit 1050 which may be incorporated into the $3^{rd}$ logic component 470, as may be desired, runt signals (signals inadequate in amplitude or time duration) at PHT_N, are amplified via gates 1060 & 1080 and held in state via hysteresis and feedback circuitry 1070, once the selection of PHASE_N has taken place. At the same time, the invention provides for disallowing a next phase PHASE_N+1 to be selected via the inverter 1090 and NAND gate 1095, as PHT_N would eventually go away, and PHT_N+1 would take over anyway. In this way two adjacent phases will not be selected during the same period.

FIG. 14 illustrates 2 exemplary partial phase stages of an 8 phase CDR $3^{rd}$ logic component 470 of FIG. 6 in accordance with an aspect of the invention, which when OR'ed together at 1096 by the OR gate 1097, provide the CLK_OUT signal 1098. The exemplary $3^{rd}$ logic component represents a "hold and disable next phase" circuit solution for the potential metastable condition of FIG. 13. Therefore, the circuitry 1050 within the $3^{rd}$ logic component 470 eliminates any potential metastable conditions that may arise at the FFs 455 and eliminates any potential multiple phase selections by picking the first phase and disabling any subsequent selected phases, if any.

Figure 15:
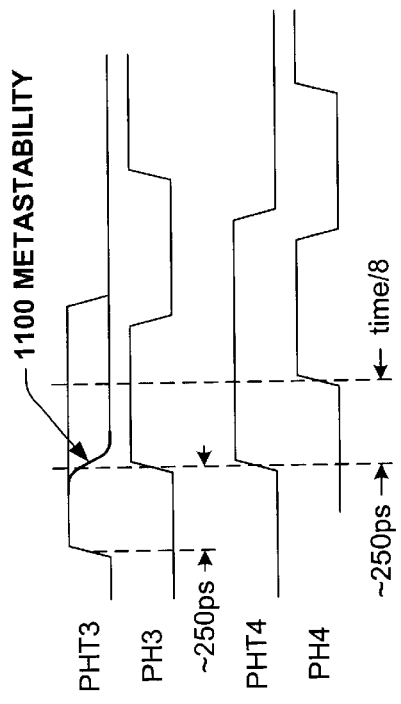
FIG. 15 is a simplified timing diagram illustrating a waveform with a potential metastable condition in FF PHT3, and other timings as presented to the "hold and disable next phase" circuit to eliminate metastable conditions in the exemplary CDR $3^{rd}$ logic component circuit in accordance with an aspect of the invention.

FIG. 15 is a simplified timing diagram illustrating exemplary specific phases of a waveform with a potential metastable condition 1100 in a FF PHT3, and other timings as presented to the "hold and disable next phase" circuit to eliminate metastable conditions in the exemplary CDR $3^{rd}$ logic component circuit 470 in accordance with another exemplary aspect of the invention. FIG. 15 also illustrates the phase offset between the successive phases PHT3 and PH3, and between PHT4 and PH4. The description of these timings is the same as that of FIG. 13 above, but with more circuit specific labels for greater understanding.

Figure 16:
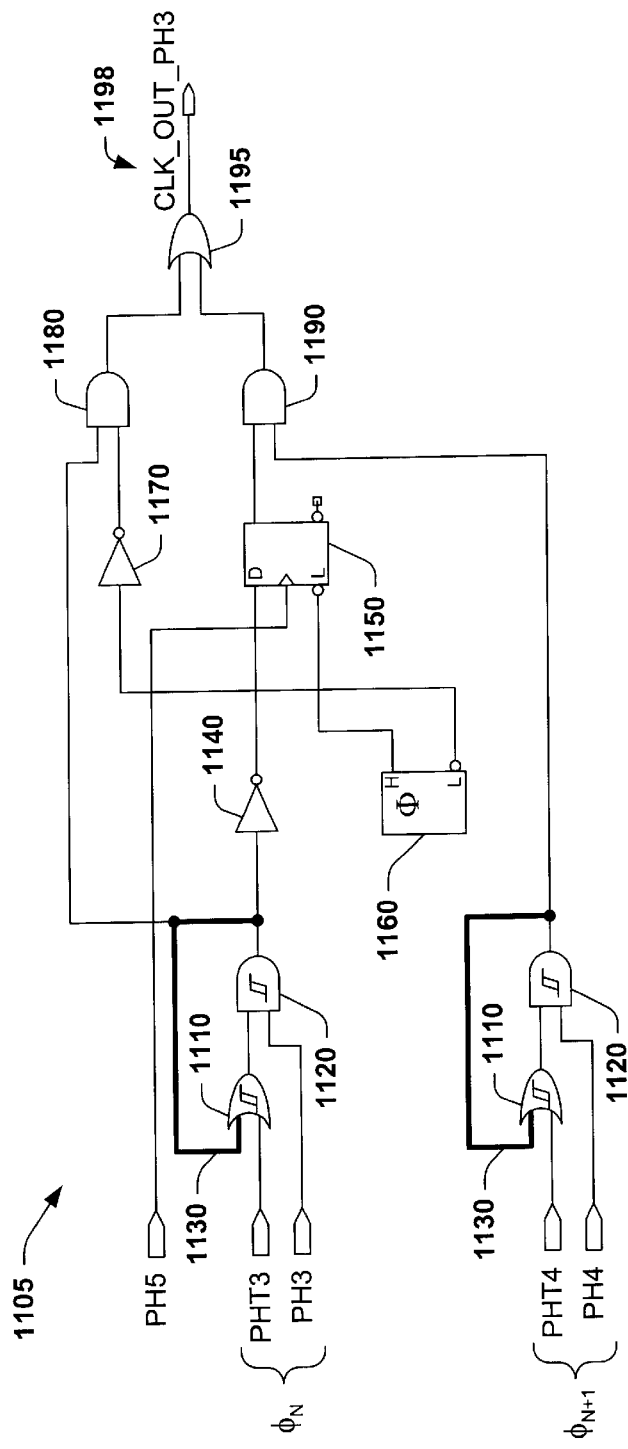
FIG. 16 is a schematic illustration of an exemplary CDR $3^{rd}$ logic component "hold and disable next phase" circuit solution for the metastable condition of FIG. 15, intended for elimination of metastable conditions and multiple phase selections by the use of hysteresis, amplification, feedback, and disabling the next phase, in accordance with another aspect of the present invention.

FIG. 16 is a schematic illustration of another, alternative exemplary CDR $3^{rd}$ logic component "hold and disable next phase" circuit 1105 solution for the potential metastable condition of FIGS. 15 or 13, intended for elimination of metastable conditions and multiple phase selections by the use of hysteresis (e.g., shown symbolically within gates 1110 & 1120), amplification, feedback, and disabling the next phase, in accordance with another aspect of the present invention. Eight (8) of the "hold and disable next phase" circuits 1105, similar to the one shown in FIG. 16, are combined to make a complete $3^{rd}$ logic component (e.g., 470 of FIG. 6). This combination of the 8 "hold and disable next phase" circuits 1105, produce a plurality of processed phase selections (475 of FIG. 6, or 1096 of FIG. 14).

The output of the exemplary $3^{rd}$ logic component "hold and disable next phase" circuit 1105, is the CLK_OUT_PH3 signal 1198. The CLK_OUT_PH3 signal 1198 output of this circuit is processed for the elimination of metastable conditions on PHT3 for the selection of phase 3 (PH3), and the disabling of the "next phase" phase 4 (PH4) and subsequent multiple phase selections. When 8 of the individual circuits 1105, are OR'ed together as shown, for example, by OR gate 1097 and the plurality of inputs 1096 of FIG. 14, a complete phase selection circuit (e.g., 485 of FIG. 6) may also be provided, which is operable to produce a best phase selection CLK_OUT signal (490 of FIG. 6, or 1098 of FIG. 14).

In operation of the circuit 1105 of FIG. 16 and the timing of FIG. 15, PHT3 attempts to select the phase PH3 via the OR gate 1110 and AND gate 1120, just as PHT3 is dying-out 1100. This condition may begin to produce a metastable runt signal, until the high amplification and hysteresis of the OR gate 1110 and AND gate 1120 quickly takes effect. When the switching threshold voltage of either of the gates has been reached, feedback 1130 from the output of the AND gate 1120 will latch and hold the input of the OR gate 1110 high. To prevent PHT4 from also being selected, as PHT3 eventually goes away and PHT4 takes over, the output of the AND gate 1120, causes the AND gate 1180 to be enabled, and via the inverter 1140 and PH5, causes the FF 1150 to be triggered. FF 1150 disables AND gate 1190, and therefore disables the next phase PH4 from the OR gate 1195. FF 1150 is used to hold this "disable next" condition in place just long enough that there will not be two adjacent phases selected during the same period. Tie-off 1160 provides a decoupled logical high and low state for the circuit 1105.

Thus, the present invention avoids the effects of metastable conditions of conventional CDR systems with an exemplary CDR $3^{rd}$ logic component containing a plurality of "hold and disable next phase" circuits 1105 similar to that of FIG. 16. Other variations of the exemplary "hold and disable next phase" circuit are contemplated as falling within the scope of the present invention, whereby the use of amplification, hysteresis, or feedback to latch the selected phase and disable the next phase, avoids the effects of metastable conditions in a CDR system.

One advantage of the present invention, is that all the functions of the exemplary CDR system discussed above may be accomplished, with a relatively small implementation of about 300 gates, for example.

Still another advantage of the present invention is that unlike the conventional CDR systems, the present invention does not use the selected phase as feedback to the local oscillator or VCO. In the conventional CDR system, if bit errors or metastable conditions occur, phase lock may also be lost, causing the local oscillator to wander without controlled feedback and additional bits may be lost. By not using phase lock feedback, the present invention has the advantage of keeping the frequency of the VCO fixed, at a more stable frequency, while providing independence from the clock. The data rate however, does maintain a quasi-fixed phase relationship to the local clock, as the plurality of clock phases are derived from the local clock.

A CDR circuit is used to recover a clock and data signal from a stream of serial data communications decoded from a receiver circuit of an ASIC or microprocessor device. Sample point averaging of multiple data bits, along with voting logic methods are used typically in the CDR circuit because they eliminate the effect of inevitable metastable conditions of the FFs which latch the data steam bits and yet make a simple system. Other conventional plesiochronous CDR circuits, however, must wait until, for example, 8 bits are stored in a shift register before voting on the best phase choice to provide phase lock (while there is no guarantee there was a transition at all within those 8 data bits, continuous phase update and thus the ability to follow a frequency offset can not be calculated. Also, an instant lock—mandatory for a burst traffic bus—is not an option at all). Because of this long delay before phase lock, or even because of jitter, conventional CDR systems may lose many bits before achieving phase lock, yet must still resolve any metastable conditions long after these events actually take place. The increasing use of higher speed serial data communications devices, such as those used in computers, peripherals, repeaters, routers and hubs, together with the standards set forth in the new USB 2.0 initiative, illustrates the need for a faster locking local clock oscillator as used in a CDR system to recover clock and data signals which are free of metastabilities and jitter, while maintaining a small and simple circuit design.

By contrast, the present invention identifies and resolves every data transition (rather than just one in 8 bits) to within the narrow window of time provided by a plurality (e.g., 8) of phase offsets (e.g., about 260 ps), providing a much faster phase acquisition and lock than that attained by a conventional CDR system.

In an alternate implementation of the present invention, some or all of the circuits and system functions described herein may be accomplished via high speed software techniques, whereby a plurality of clock phases which are evenly spaced and offset between successive phases are used to identify a transition of a serial communications data stream to select a phase for the fast locking of a CDR circuit, and for the elimination of multiple phase selections and metastable conditions of the data, to recover clock and data signals which are free from data jitter and frequency wander.

The system 400 therefore receives a decoded serial communications data stream into a plurality of FFs comprising a $1^{st}$ latch, and a plurality of clock phases which are evenly spaced and offset from each other. The $1^{st}$ latch FFs are individually adapted to be triggered by a clock phase of the plurality of clock phases, and latch a plurality of states of the data stream as each clock phase to the $1^{st}$ latch goes high in succession. The plurality of states of the data stream identifies a data transition point from the "0" states transition to a "1" state as detected by a $1^{st}$ logic component, comprising, for example, a plurality of XOR and OR gates adapted to receive the plurality of data states from the $1^{st}$ latch and generate a plurality of data transition determinations. The data transition determinations are received and latched by a $2^{nd}$ latch, which is coupled to a $2^{nd}$ logic component operable to determine how many and which phases have detected a data stream transition. The $2^{nd}$ logic component then compares these resulting latched data transition determinations to a last or previous phase selection and generates a plurality of phase determinations based upon the comparison.

The plurality of phase determinations are latched by a $3^{rd}$ latch which supplies the $2^{nd}$ logic component with the last phase selections and produces a plurality of latched phase determination choices to a $3^{rd}$ logic component. The $3^{rd}$ logic component is operable to eliminate metastabilities by amplification, hysteresis, and feedback of the selections, and is further operable to eliminate multiple phase selections via a plurality of AND gate and FFs circuits which also disable the next phase selections for a period of time, and generates a plurality of processed phase selections. A single new phase selection is then made, which is used to latch and recover a clock and data signal which is free of metastable conditions and independent of data jitter and frequency wander.

Figure 17:
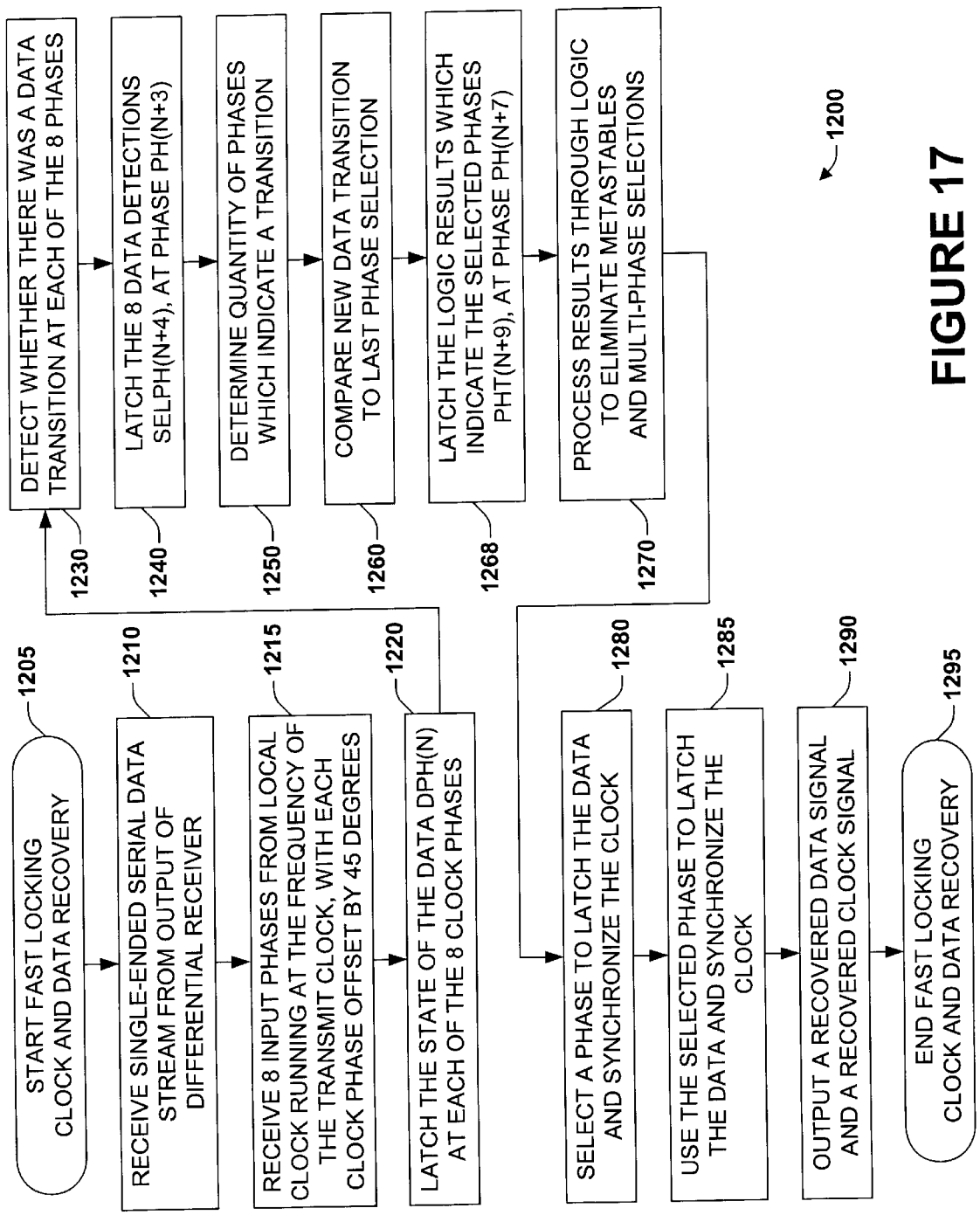
FIG. 17 is a flow diagram illustrating an exemplary method for fast locking clock data recovery operation in association with an aspect of the present invention.

Another aspect of the present invention provides a methodology for fast locking of the clock and data recovery operation in data communication and transmission applications in the manufacture of ASIC and microprocessor chips illustrated and described herein, as well as with other such devices. Referring now to FIG. 17, an exemplary method 1200 is illustrated for a fast locking clock and data recovery operation in a data communications device in association with an aspect of the present invention. While the exemplary method 1200 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method 1200 may be implemented in association with the apparatus and systems illustrated and described herein as well as in association with other systems not illustrated.

The method 1200 comprises receiving from a differential receiver, for example, a decoded single-ended serial communications data stream and a plurality of clock phases which are, for example, evenly spaced and offset from each other into a plurality of FFs forming a latch. The latch FFs are triggered in succession with an associated clock phase to latch a plurality of states of the data stream, wherein the plurality of states are used to detect whether there was a transition in the data. The plurality of data transition detections are then latched and used to, determine the quantity of phases which indicate a transition. The transition indications are then compared with a last or previous phase selection, and the results are latched which indicate a plurality of latched phase determinations. The logical results are processed, for example, through a plurality of gates and FF logic to amplify and latch the selection to eliminate any metastable conditions or multiple phase selections. A single phase is then selected to latch the data and synchronize the clock, thus recovering the data signal which is free of metastable conditions and jitter, while maintaining a small and simple CDR design.

The fast locking clock and data recovery operation method begins at step 1205. At 1210 a decoded single-ended serial communications data stream is received, for example, as an output of a differential receiver into a $1^{st}$ latch comprising a plurality of D-FFs. At 1215 a plurality of clock phases which are, for example, evenly spaced and offset from each other are received from a clock phase generator coupled to a VCO local oscillator and also input to the $1^{st}$ latch. The $1^{st}$ latch records the states of the data stream as each of the FFs are triggered in succession by the plurality of clock phases at 1220.

The states of the data in the latch are examined at step 1230 for data transitions between each data detection associated with a phase. The results of the data transition detections are latched at 1240. A determination is made at 1250, as to the quantity of phases and which phases have detected a data transition. At 1260 the results of the new data transition detections are compared to the last phase selection. At 1268 the logic results are latched to indicate which phases selections are determined to be acceptable choices. The results are also processed at 1270, through a plurality of logic circuits individually adapted to eliminate metastable conditions in the data and to eliminate multiple phase selections. A single phase is selected from the plurality of processed phase selections at 1280. At 1285 the selected single phase is used to latch the data steam and synchronize the clock.

Thereafter at step 1290, a clock and data signal, which is free of metastable conditions and jitter, is recovered from a serial data stream of a communications receiver device used in the manufacture of ASIC and microprocessor chips in a fast locking clock and data recovery circuit, while maintaining a small and simple CDR design. At step 1290, a determination may also be made whether the fast locking CDR operation is still enabled. If the operation is still enabled, the fast locking CDR operation continues at 1210, otherwise the operation thereafter ends at 1295, and the method 1200 may be repeated for subsequent fast locking CDR operations of a communications device.

Figure 18:
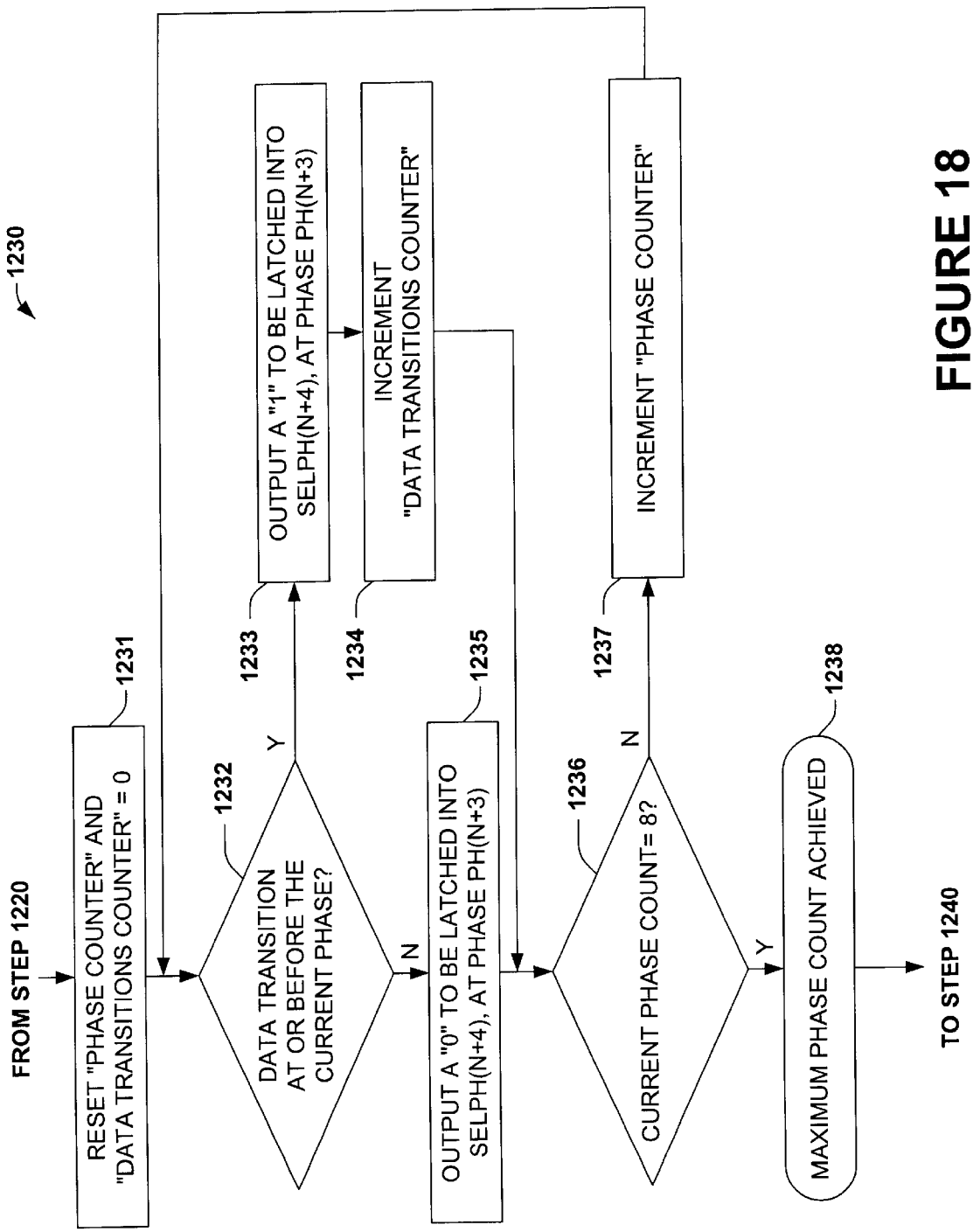
FIG. 18 is a flow diagram illustrating an exemplary method for the transition detection step 1230 of FIG. 17 for the fast locking clock data recovery operation in association with an aspect of the present invention.

FIG. 18 is a flow diagram illustrating an exemplary method for the transition detection step 1230 of FIG. 17 for the fast locking clock data recovery operation in association with an aspect of the present invention. FIG. 18 further illustrates an exemplary method for the transition detection step 1230 of the method 1200 of FIG. 17 for the fast locking clock data recovery operation in association with an aspect of the present invention. The transition detection operation of step 1230, hereinafter begins with step 1231 where a "phase counter" and a "data transitions counter" is reset to "0". The phase counter will keep track of the present clock phase number which is being used to detect a transition in the data stream, while the data transitions counter will count the number of transitions which have been detected thus far within N clock phases.

A determination is made at step 1232, whether a data transition has taken place at or before the current phase tested (Note, as this is actually a continuous process, the last state for a data transition determination will be known at all times). If a data transition has taken place, a "1" state is output from the $1^{st}$ logic component at step 1233, and is latched into SELPH(N+4), at phase PH(N+3). At step 1234 the "data transitions counter" is incremented and continues to step 1236. If a data transition has not taken place at step 1232, then a "0" state is output from the $1^{st}$ logic component at step 1235, and is latched into SELPH(N+4), at phase PH(N+3). In either case, the method continues at step 1236 with a check on the present count of the clock phase counter. If the present count is not equal to the maximum phase count of N, then the phase counter is incremented at step 1237 and the method continues to step 1232. Otherwise the maximum phase count of N (e.g., 8 phases) has been achieved, the next data transition is awaited, and the method continues to step 1240 where the data transition detections are latched by the $2^{nd}$ latch.

FIG. 19 further illustrates an exemplary method for the data transition detection quantity determination and phase selection step 1250 of the method 1200 of FIG. 17 for the fast locking clock data recovery operation in association with an aspect of the present invention. The data transition detection quantity determination and phase selection operation of step 1250, hereinafter begins with step 1251 wherein a determination is made as to whether there were any transitions within the last N (e.g., 8) phases. If there where no data transitions detected, the previous (last) phase used is selected at step 1252, and the method continues to FIG. 17 and step 1260.

Otherwise, if there were transitions detected (e.g., count >0), the data transition count is again examined whether there was one transition detected at step 1253. If one transition was detected, the indicated phase is selected at step 1254, and the method continues to FIG. 17 and step 1260. Otherwise, if there was greater than 1 transition detected, the data transition count is again examined whether there was 2 transitions detected at step 1255. If 2 transitions were detected at step 1255, the first of the 2 phases is selected at step 1256, and the method continues to FIG. 17 and step 1260. Otherwise, if there was greater than 2 transitions detected, the data transition count is again examined whether there was 3 transitions detected at step 1257. If 3 transitions were detected at step 1257, the center of the 3 phases is selected at step 1258, and the method continues to FIG. 17 and step 1260. Otherwise, if there were greater than 3 transitions detected, too many data transitions were detected, and the previous (last) phase which was selected is used at step 1259, and the method continues to FIG. 17 and step 1260.

FIG. 20 further illustrates an exemplary method for the data transition detection comparison to last phase selection step 1260 of the method 1200 of FIG. 17 for the fast locking clock data recovery operation in association with another aspect of the present invention. The data transition detection comparison to last phase selection step 1260, hereinafter begins with step 1261, wherein a comparison is made as to whether the new data transition occurred later than (e.g., <, case "B"), at the same time as (e.g., =, case "A"), or earlier than (e.g., >, case "C") the last selected phase transition.

If the new data transition occurred later than (e.g., <, case "B") the last selected phase transition, then another determination is made at step 1262, whether there was more than 2 phase jumps (e.g., 2 phase changes, or a time difference of 2 phase offsets) between the new data transition and the last phase selection. If there was not more than 2 phase jumps, then the $2^{nd}$ logic component outputs a logic result which indicates the new phase should be selected at step 1264, and the method continues back to FIG. 17 and step 1268. Otherwise, if there were more than 2 phase jumps between the new data transition and the last phase selection, then the $2^{nd}$ logic component outputs a logic result which indicates the last phase should be selected at step 1266.

If the new data transition occurred at the same time as (e.g., =, case "A") the last selected phase transition, then the $2^{nd}$ logic component outputs a logic result which indicates the new phase should be selected at step 1264, and the method continues to FIG. 17 and step 1268.

If the new data transition occurred earlier than (e.g., >, case "C") the last selected phase transition, then another determination is made at step 1263, whether there was more than a −1 phase jump between the new data transition and the last phase selection. If there was not more than a −1 phase jump then the $2^{nd}$ logic component outputs a logic result which indicates the new phase should be selected at step 1264, and the method continues to FIG. 17 and step 1268. Otherwise, if there was more than a −1 phase jump between the new data transition and the last phase selection, then the data is processed thru a special logic circuit (not shown) which prohibits phase jumps of greater than −1 jumps at step 1265, and the $2^{nd}$ logic component outputs a logic result which indicates the last phase should be selected at step 1266, and the method continues to FIG. 17 and step 1268.

Figure 21:
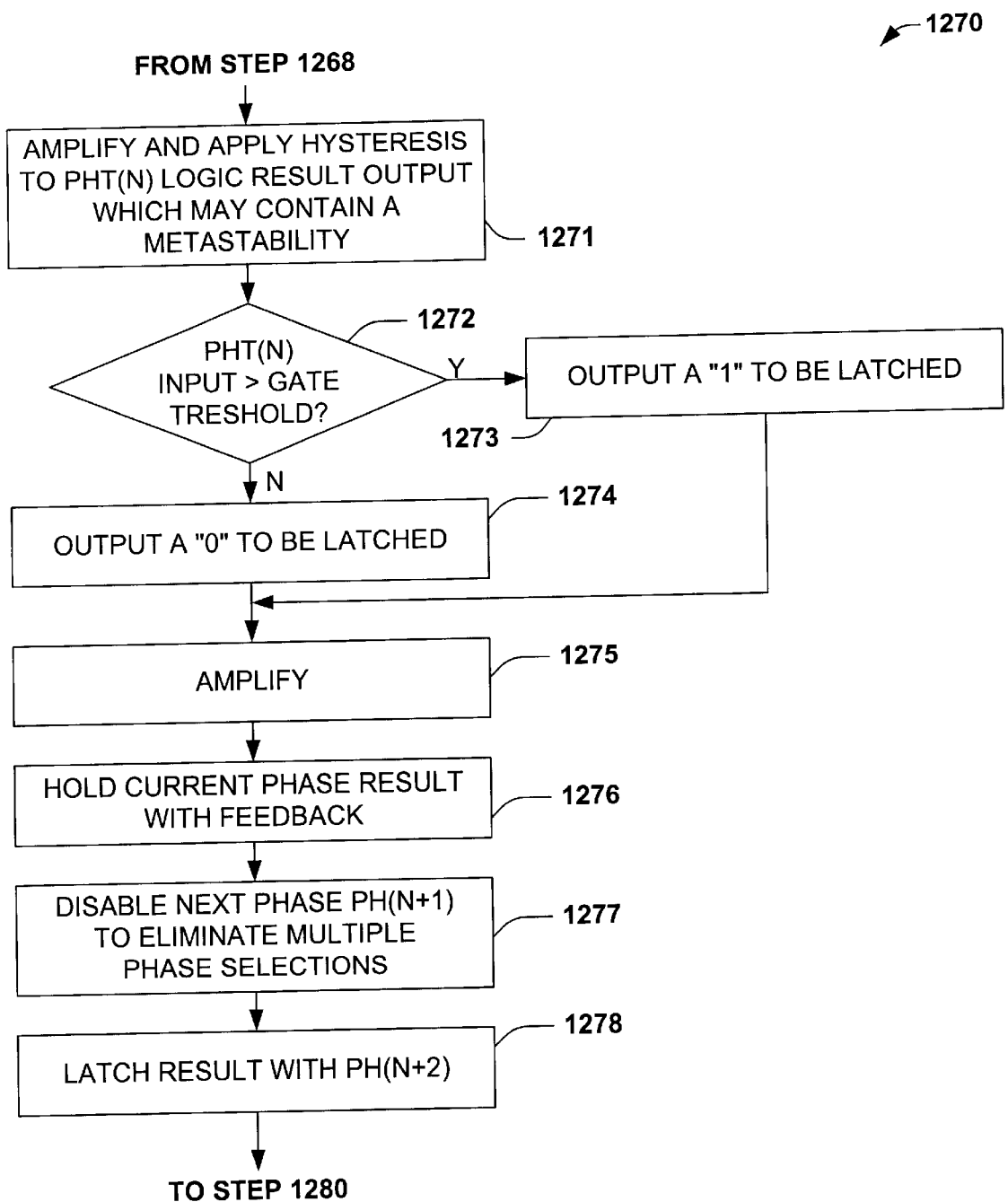
FIG. 21 is a flow diagram illustrating an exemplary method for the elimination of metastable conditions and multi-phase selections step 1270 of FIG. 17 for the fast locking clock data recovery operation in association with an aspect of the present invention.

FIG. 21 further illustrates an exemplary method for the elimination of metastables and multi-phase selections step 1270 of FIG. 17 for the fast locking clock data recovery operation in association with an aspect of the present invention. The elimination of metastables and multi-phase selections step 1270, hereinafter begins with step 1271, wherein amplification and hysteresis are applied in a plurality of such circuits, to the PHT(N+9) logic result output, which may contain a metastability.

A determination is made at step 1272, whether the PHT (N) input is greater than the gate input switching threshold voltage. If the PHT(N) input is greater than the gate input threshold voltage, a "1" state is output from the $3^{rd}$ logic component at step 1273 to be latched, and the method continues to step 1275. Otherwise, a "0" state is output from the $3^{rd}$ logic component at step 1274 to be latched. At step 1275, additional amplification is applied to the phase selection PHT(N). The current phase output result is held with feedback at step 1276. At step 1277, the next phase PH(N+1), is disabled by the gating the PH(N) selection signal with the next phase PH(N+1) signal. Finally, the result of the elimination Of metastables and multi-phase selections operations of step 1270 is latched at step 1278, with phase PH(N+2), and the method continues to FIG. 17 and step 1280.

The methodology 1200 thus provides for a fast locking clock and data recovery system used in data communications applications of ASIC and microprocessor devices, in which the CDR circuit uses a plurality of clock phases evenly spaced and offset between successive phases to identify a data transition point of the data stream within one data transition time period, and a metastable and multi-phase elimination circuit to provide a plurality of processed phase selections, and a phase selection circuit to provide a single best clock phase selection, wherein the single best clock phase selection is used to latch and produce a recovered clock and data signal which is free of metastable conditions and independent of data jitter and frequency wander. Other variants of methodologies may be provided in accordance with the present invention, whereby fast locking clock and data recovery is accomplished employing a plurality of clock phase signals which are evenly spaced and offset between successive phases, and are used to identify the data transition within one data transition time period and provide a quasi-fixed phase relationship to the local clock in a CDR circuit, and a metastable and multi-phase elimination circuit.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A system for producing recovered clock and data signals for serial data communications operations, comprising:

a $1^{st}$ logic system operable to receive a decoded single ended serial data stream, and a plurality of clock phases, which are evenly spaced and offset between successive phases derived from the local clock signal, wherein the $1^{st}$ logic system is configured to detect whether a transition of the data stream took place corresponding with one of the plurality of clock phases and independent of an event caused by metastability, to generate one of a corresponding plurality of data transition detections based upon the serial data stream, and the plurality of clock phases;

a $2^{nd}$ logic system operable to receive a plurality of data transition detections, a plurality of clock phases, and a plurality of previous clock phase selections, to determine which phases corresponded to a data stream transition, to compare the new data transition to a last phase selection transition, and to generate a plurality of phase determinations based upon the comparisons;

a $3^{rd}$ logic system operable to receive the plurality of phase determinations, to apply amplification, hysteresis and feedback, and to generate a plurality of processed phase selections based upon the plurality of phase determinations, and an elimination of metastable conditions and multiple phase selections; and a phase selection logic operable receive the plurality of clock phase signals, and to receive and to use the plurality of processed phase selections to make a best phase selection which is used to securely latch and recover the clock and data signals, whereby the recovered clock and data signals are free of metastable conditions and multiple phase selections, and independent of jitter and wander.

2. The system of claim 1, wherein the $1^{st}$ logic system of the CDR circuit comprises:

a $1^{st}$ latch, comprising a plurality of FFs individually adapted to receive the decoded single ended serial data stream, and one of a plurality of clock phase signals, and generate one of a corresponding plurality of data state indications, whereby the $1^{st}$ latch FFs are individually triggered by one of the plurality of clock phases, to latch a logical state of the data stream at a transition of the one of the plurality of clock phase signals corresponding therewith; and a $1^{st}$ logic component, comprising a plurality of XOR gates and OR gates, individually adapted to receive one of the plurality of data state indications from the $1^{st}$ latch, and generate one of a corresponding plurality of data transition detections.

3. The system of claim 1, wherein the $2^{nd}$ logic system of the CDR circuit comprises:

a $2^{nd}$ latch, comprising a plurality of FFs individually adapted to receive one of the plurality of data transition detections, and the one of the corresponding plurality of clock phase signals, and generate one of a corresponding plurality of latched transition detections, whereby the $2^{nd}$ latch FFs are individually triggered and latched by the one of the plurality of clock phase signals corresponding therewith; and a $2^{nd}$ logic component, comprising a plurality of AND gates operable to receive the plurality of latched transition detections from the $2^{nd}$ latch, and a plurality of previous clock phase selections in the form of feedback, to determine which phases detected a data stream transition, to select a new phase associated with the transition detections, and to compare the new data transition to a last phase selection, and generate a plurality of phase determinations based upon the comparisons.

4. The system of claim 1, wherein the $3^{rd}$ logic system of the CDR circuit comprises:

a $3^{rd}$ latch, comprising a plurality of FFs individually adapted to receive one of the plurality of phase determinations, and the one of the corresponding plurality of clock phase signals, and generate one of a corresponding plurality of latched phase determinations, whereby the $3^{rd}$ latch FFs are individually triggered and latched by the one of the plurality of clock phase signals corresponding therewith; and a $3^{rd}$ logic component, comprising a plurality of AND gates and FFs individually adapted to receive one of the plurality of latched phase determinations, to eliminate metastable conditions and multiple phase selections by the amplification, hysteresis and feedback of the selections, and to generate a plurality of processed phase selections based upon, the plurality of latched phase determinations, and the elimination of metastable conditions and multiple phase selections.

5. The system of claim 1, wherein the plurality of clock phases, which are evenly spaced and offset between successive phases derived from the local clock signal, comprises 8 phases.

6. A system for producing recovered clock and data signals for serial data communications operations, comprising:

a $1^{st}$ logic system operable to receive a decoded single ended serial data stream, and a plurality of clock phases, which are evenly spaced and offset between successive phases derived from the local clock signal, wherein the $1^{st}$ logic system is configured to detect whether a transition of the data stream took place corresponding with one of the plurality of clock phases and to generate one of a corresponding plurality of data transition detections based upon the serial data stream, and the plurality of clock phases;

a $2^{nd}$ logic system operable to receive a plurality of data transition detections, a plurality of clock phases, and a plurality of previous clock phase selections, to determine which phases corresponded to a data stream transition, to compare the new data transition to a last phase selection transition, which produce a plurality of phase determinations based upon the comparisons, and to generate a plurality of phase selections based upon the plurality of data transition detections, the plurality of clock phases, and the plurality of previous clock phase selections; and a phase selection logic operable receive the plurality of clock phase signals, and to receive and to use the plurality of phase selections to make a best phase selection which is used to securely latch and recover the clock and data signals, whereby the recovered clock and data signals are free of metastable conditions and multiple phase selections, and independent of jitter and wander.

7. The system of claim 6, wherein the $1^{st}$ logic system of the CDR circuit comprises:

a $1^{st}$ latch, comprising a plurality of FFs individually adapted to receive the decoded single ended serial data stream, and one of a plurality of clock phase signals, and generate one of a corresponding plurality of data state indications, whereby the $1^{st}$ latch FFs are individually triggered by one of the plurality of clock phases, to latch a logical state of the data stream at a transition of the one of the plurality of clock phase signals corresponding therewith; and a $1^{st}$ logic component, comprising a plurality of XOR gates and OR gates, individually adapted to receive one of the plurality of data state indications from the $1^{st}$ latch, and generate one of a corresponding plurality of data transition detections.

8. The system of claim 6, wherein the $2^{nd}$ logic system of the CDR circuit comprises:

a $2^{nd}$ latch, comprising a plurality of FFs individually adapted to receive one of the plurality of data transition detections, and the one of the corresponding plurality of clock phase signals, and generate one of a corresponding plurality of latched transition detections, whereby the $2^{nd}$ latch FFs are individually triggered and latched by the one of the plurality of clock phase signals corresponding therewith;

a $2^{nd}$ logic component, comprising a plurality of AND gates operable to receive the plurality of latched transition detections from the $2^{nd}$ latch, and a plurality of previous clock phase selections in the form of feedback, to determine which phases detected a data stream transition, to select a new phase associated with the transition detections, and to compare the new data transition to a last phase selection, and to generate a plurality of phase determinations based upon the determinations and comparisons; and a $3^{rd}$ latch, comprising a plurality of FFs individually adapted to receive one of the plurality of phase determinations, and the one of the corresponding plurality of clock phase signals, and generate one of the corresponding plurality of phase selections, whereby the $3^{rd}$ latch FFs are individually triggered and latched by the one of the plurality of clock phase signals corresponding therewith.

9. A method of fast locking and recovery of a clock and data signal from a serial data stream in a communications device which has a high jitter tolerance and requires a small gate count implementation, while eliminating the effects of metastability, comprising the step of:

receiving a decoded single-ended serial communications data stream into a $1^{st}$ logic system;

receiving a plurality of clock phases which are evenly spaced and offset between successive clock phases;

latching the logical state of the data stream into a $1^{st}$ logic system, corresponding in time to each phase of the plurality of clock phases, thereby recording a plurality of logical states of the data stream, individually corresponding with one of the plurality of clock phase transitions;

detecting whether there was a data transition corresponding to one of the plurality of clock phases, by examining whether there was a change of state of the data stream recorded between successive phases;

latching in a $2^{nd}$ logic system, the results of the data transition detections at a clock phase which is offset by +3 clock phases, thereby offsetting the phase selection to about the middle of the data waveform to avoid the effects of jitter or metastability;

determining the quantity of phases which were detected and which phases of the plurality of clock phases which have detected a new data transition;

comparing the results of the new data transition determinations to a last phase selections, thereby producing a plurality of phase determination results;

latching in a $3^{rd}$ logic system the comparison phase determination results at a clock phase which is offset by +4 clock phases, thereby offsetting the phase selection to about the middle of the data waveform to avoid the effect of jitter or metastability, and compensate for calculation time to provide a plurality of latched phase determinations;

processing the plurality of latched phase determination results through a plurality of logic circuits individually adapted to eliminate the effects of metastable conditions and multiple phase selections, thereby producing a plurality of acceptable phase selections;

selecting a single phase of the plurality of acceptable phase selections to latch the data and synchronize the clock;

latching the data stream data and synchronizing the clock with the single phase selection; and outputting a recovered clock and data signal within one clock data cycle, which is free of metastable conditions and independent of jitter and wander, while maintaining a small and simple CDR design.

10. The method of claim 9, wherein detecting whether there was a data transition corresponding to one of the plurality of clock phases, by examining whether there was a change of state of the data stream recorded between successive phases comprises:

a) resetting a phase counter and a data transitions counter to zero count;

b) determining if a data transition occurred before a current phase, by comparing the last state of the data stream detected and the current state;

c) outputting a logical "1" state, which is to be latched at a clock phase (N+3), if the determination indicated that a transition was detected;

d) incrementing the data transition counter;

e) otherwise, outputting a logical "0" state, which is to be latched at the clock phase (N+3), if the determination indicated that a transition was not detected;

f) determining if the current phase count is at a maximum count of 8;

g) incrementing the phase counter if the phase count is not at a maximum count of 8; and repeating steps (b) thru (f) until the phase count is equal to 8; and h) ending the data transition detection operation when the maximum phase count is achieved.

11. The method of claim 9, wherein determining the quantity of phases which were detected and which phases of the plurality of clock phases which have detected a new data transition comprises:

determining if there any data transitions were detected;

selecting the previous phase if it is determined that there were no data transitions detected, and ending the quantity determination operation;

otherwise, determining if 1 data transition was detected;

selecting the 1 phase indicated if it is determined that one data transition was detected, and ending the quantity determination operation;

otherwise, determining if 2 data transitions were detected;

selecting the first of the 2 phases indicated if it is determined that 2 data transitions were detected, and ending the quantity determination operation;

otherwise, determining if 3 data transitions were detected;

selecting the center phase of the 3 phases indicated if it is determined that 3 data transitions were detected, and ending the quantity determination operation; and otherwise, selecting the previous phase if >3 data transitions were detected, and ending the quantity determination operation.

12. The method of claim 9, wherein comparing the results of the new data transition determinations to a last phase selections, thereby producing a plurality of phase determination results comprises:

a) comparing the new data transition which was detected to the last phase selected;

b) determining if there was a phase change of >2 phases between the new data transition and the last phase selected, if the result of the comparison step (a) indicated a case "B" situation, in which the data transition was later than the transition of the last phase;

c) outputting a logic comparison result for a new phase selection if it is determined in step (b) that there was not >2 phase changes between the new data transition and the last phase selected, and ending the phase comparison operation;

d) outputting a logic comparison result for a last phase selection if it is determined in step (b) that there was >2 phase changes between the new data transition and the last phase selected, and ending the phase comparison operation;

e) determining if there was a phase change of >−1 phases between the last phase selected and the new data transition, if the result of the comparison step (a) indicated a case "C" situation, in which the data transition was earlier than the transition of the last phase;

f) outputting a logic comparison result for a new phase selection if it is determined in step (e) that there was not >−1 phase changes between the last phase selected and the new data transition, and ending the phase comparison operation;

g) processing the transition detections thru a logic circuit which eliminates phase change indications of >−1 phase changes, if it is determined in step (e) that there was >−1 phase changes between the last phase selected and the new data transition, and outputting a logic comparison result for a last phase selection, and ending the phase comparison operation; and h) otherwise, outputting a logic comparison result for a new phase selection, when the result of the comparison step (a) indicates a case "A" situation, in which the data transition about the same time as the transition of the last phase selection, and ending the phase comparison operation.

13. The method of claim 9, wherein processing the plurality of latched phase determination results through a plurality of logic circuits individually adapted to eliminate the effects of metastable conditions and multiple phase selections, thereby producing a plurality of acceptable phase selections comprises:

amplifying and applying hysteresis to the PHT(N) logic results output which may contain the effects of metastable conditions;

determining if a PHT(N) phase determination result input has an amplitude greater than the logic gate switching threshold voltage;

outputting a logical "1" state, which is to be latched at a clock phase (N+4), if the determination indicated that the logic gate switching threshold voltage was achieved, thereby indicating that the current phase being processed was acceptable as a potential phase selection;

otherwise, outputting a logical "0" state, which is to be latched at the clock phase (N+4), if the determination indicated that the logic gate switching threshold voltage was not achieved, thereby indicating that the current phase being processed was unacceptable as a potential phase selection;

continuing to amplify the logic results thru additional gates;

applying feedback to the logic gates to hold the state of the acceptable phase selection;

disabling the next phase PH(N+1) with the feedback and logic, to eliminate the possibility of multiple phase selections; and latch the final phase selection result with the PH(N+2) clock phase.

* * * * *